(12) United States Patent
Fukushima et al.

(10) Patent No.: US 10,999,660 B2
(45) Date of Patent: May 4, 2021

(54) WATERPROOF MEMBER AND ELECTRONIC DEVICE

(71) Applicant: NITTO DENKO CORPORATION, Osaka (JP)

(72) Inventors: Tamao Fukushima, Osaka (JP); Bunta Hirai, Osaka (JP); Yosuke Sugaya, Osaka (JP); Yuichi Abe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/040,146

(22) PCT Filed: Dec. 25, 2019

(86) PCT No.: PCT/JP2019/051039
§ 371 (c)(1),
(2) Date: Sep. 22, 2020

(87) PCT Pub. No.: WO2020/138250
PCT Pub. Date: Jul. 2, 2020

(65) Prior Publication Data
US 2021/0092499 A1 Mar. 25, 2021

(30) Foreign Application Priority Data
Dec. 28, 2018 (JP) .............................. JP2018-248624

(51) Int. Cl.
*H04R 1/02* (2006.01)
*G10K 11/18* (2006.01)
(Continued)

(52) U.S. Cl.
CPC ........... *H04R 1/023* (2013.01); *G06F 1/1656* (2013.01); *G10K 11/18* (2013.01); *H05K 5/0095* (2013.01)

(58) Field of Classification Search
CPC ....... H04R 1/023; G06F 1/1656; G10K 11/18; H05K 5/0095
(Continued)

(56) References Cited

U.S. PATENT DOCUMENTS 5,828,012 A * 10/1998 Repolle .................. G10K 11/18
181/175
6,512,834 B1 * 1/2003 Banter ................... H04R 1/086
381/189
(Continued)

FOREIGN PATENT DOCUMENTS

JP 2002-502561 A 1/2002
JP 2003-503991 A 1/2003
(Continued)

OTHER PUBLICATIONS

International Search Report issued in Patent Application No. PCT/JP2019/051039, dated Mar. 17, 2020, along with an English translation thereof.
(Continued)

*Primary Examiner* — Forrest M Phillips
(74) *Attorney, Agent, or Firm* — Greenblum & Bernstein, P.L.C.

(57) ABSTRACT

The waterproof member of the present disclosure includes a waterproof membrane configured to prevent entry of water while permitting sound and/or gas to pass therethrough, and a support layer having air permeability in a thickness direction thereof. The waterproof member has a joining region where the waterproof membrane and the support layer are joined, and a non-joining region where the waterproof membrane and the support layer are spaced apart from each other. The non-joining region is surrounded by the joining region when viewed in a direction perpendicular to a main surface of the waterproof membrane. A thickness of the support layer in the non-joining region is 500 μm or less.

(Continued)

A spacing distance between the waterproof membrane and the support layer in the non-joining region is 150 μm or less. An air resistance in an in-plane direction of the support layer is greater than 80,000 seconds/100 mL.

11 Claims, 8 Drawing Sheets

(51) Int. Cl.
 *H05K 5/00* (2006.01)
 *G06F 1/16* (2006.01)
(58) Field of Classification Search
 USPC .......................................................... 381/386
 See application file for complete search history.

(56) References Cited

U.S. PATENT DOCUMENTS

| | | | | |
|---|---|---|---|---|
| 8,565,470 | B2* | 10/2013 | Kobayashi | H04R 7/22 |
| | | | | 381/386 |
| 2005/0175211 | A1* | 8/2005 | Suzuki | H04R 1/023 |
| | | | | 381/395 |
| 2008/0044053 | A1* | 2/2008 | Belanger | H04R 1/023 |
| | | | | 381/391 |
| 2009/0268928 | A1 | 10/2009 | Ikeyama et al. | |
| 2011/0069855 | A1 | 3/2011 | Tokuda et al. | |
| 2011/0117304 | A1 | 5/2011 | Ueki et al. | |
| 2013/0156985 | A1 | 6/2013 | Karube et al. | |
| 2013/0333978 | A1 | 12/2013 | Abe et al. | |
| 2016/0301998 | A1 | 10/2016 | Abe et al. | |
| 2019/0255801 | A1 | 8/2019 | Seo | |

FOREIGN PATENT DOCUMENTS

| | | |
|---|---|---|
| JP | 2009-290466 A | 12/2009 |
| JP | 2010-004397 A | 1/2010 |
| KR | 10-2008-0064832 A | 7/2008 |
| KR | 10-2014-0010124 A | 1/2014 |
| KR | 10-2018-0006046 A | 1/2018 |
| WO | 2012/164799 A1 | 12/2012 |
| WO | 2015/072149 A1 | 5/2015 |

OTHER PUBLICATIONS

Japan Official Action, "Decision to Grant a Patent", in Japan Patent Application No. 2019-235308, dated Jun. 2, 2020 and English language translation thereof.

Korean Office Action issued in Korean Patent Application No. 10-2020-7021669, dated Jan. 7, 2021 and English translation thereof.

* cited by examiner

WATERPROOF MEMBER AND ELECTRONIC DEVICE

TECHNICAL FIELD

The present invention relates to a waterproof member and an electronic device.

BACKGROUND ART

Electronic devices such as wearable devices including smart watches, smartphones, mobile phones, and cameras have an audio function. A sound converter (transducer) such as a microphone and a speaker is housed inside a housing of an electronic device having an audio function. The housing of the electronic device is normally provided with an opening (external sound-transmitting port) in order to transmit sound between the sound converter and the outside. Meanwhile, entry of water into the housing has to be prevented. Thus, a waterproof sound-transmitting membrane that prevents entry of water while permitting sound to pass therethrough is attached to the external sound-transmitting port. A waterproof sound-transmitting member that includes a waterproof sound-transmitting membrane and a support layer supporting the waterproof sound-transmitting membrane has been known. Since the support layer is included in the member, for example, breaking of the waterproof sound-transmitting membrane due to the water pressure applied to the member when an electronic device is dropped into water can be prevented. Patent Literature 1 discloses a waterproof sound-transmitting member in which a porous polytetrafluoroethylene (hereinafter, referred to as "PTFE") membrane and a porous support layer formed from a porous material are selectively bonded to each other at peripheral portions thereof.

CITATION LIST

Patent Literature

Patent Literature 1: JP 2002-502561 A

SUMMARY OF INVENTION

Technical Problem

In the waterproof sound-transmitting member of Patent Literature 1, the waterproof sound-transmitting membrane and the support layer independently freely vibrate in the inner non-bonding region where the waterproof sound-transmitting membrane and the support layer are not bonded to each other, whereby high sound transmission characteristics can be obtained even though the support layer is included. However, in order to respond to size reduction of electronic devices, the size of the waterproof sound-transmitting member also tends to be limited. Therefore, further improvement of sound transmission characteristics is required for the waterproof sound-transmitting member.

Moreover, a waterproof membrane may be attached to an opening that is provided in a housing of an electronic device and through which transmission of sound is not required. The opening is, for example, a ventilation port for ensuring ventilation between the inside and the outside of the housing. In this case, the waterproof membrane serves only as a waterproof air-permeable membrane that prevents entry of water while permitting gas to pass therethrough. A waterproof air-permeable member that includes a waterproof air-permeable membrane and a support layer supporting the membrane is also used.

It is an object of the present invention to improve the characteristics of a waterproof member that is a waterproof sound-transmitting member and/or a waterproof air-permeable member.

Solution to Problem

Conventionally, improvement of the sound transmission characteristics of a waterproof sound-transmitting member that includes a waterproof sound-transmitting membrane and a support layer is achieved by improvement of the sound transmission characteristics of the waterproof sound-transmitting membrane. However, there is a limit to improvement of the sound transmission characteristics only by improvement of the waterproof sound-transmitting membrane. In addition, the improvement of the sound transmission characteristics of the waterproof sound-transmitting membrane may reduce the waterproofness of this membrane. Through the study by the present inventors, it has been found that, in a waterproof sound-transmitting member formed by selectively bonding a waterproof sound-transmitting membrane and a support layer to each other, improvement of the support layer improves the sound transmission characteristics. This improvement of the support layer can also improve the characteristics of the waterproof air-permeable member.

Specifically, the present invention provides a waterproof member including a waterproof membrane configured to prevent entry of water while permitting sound and/or gas to pass therethrough, and a support layer having air permeability in a thickness direction thereof, wherein the waterproof member has a joining region where the waterproof membrane and the support layer are joined, and a non-joining region where the waterproof membrane and the support layer are spaced apart from each other, the non-joining region is surrounded by the joining region when viewed in a direction perpendicular to a main surface of the waterproof membrane, a thickness of the support layer in the non-joining region is 500 μm or less, a spacing distance between the waterproof membrane and the support layer in the non-joining region is 150 μm or less, and an air resistance in an in-plane direction of the support layer is greater than 80,000 seconds/100 mL.

According to another aspect, the present invention provides an electronic device including:

a housing having an opening; and the waterproof member of the present invention attached to the housing so as to close the opening, wherein the member is attached to the housing such that the waterproof membrane side of the member faces the outside of the housing and the support layer side of the member faces the inside of the housing.

Advantageous Effects of Invention

According to the present invention, the characteristics of a waterproof member including a waterproof sound-transmitting membrane and a support layer for the waterproof sound-transmitting membrane can be improved, including improvement of the sound transmission characteristics of a waterproof sound-transmitting member including a waterproof sound-transmitting membrane and a support layer for the membrane.

DESCRIPTION OF EMBODIMENTS

Hereinafter, embodiments of the present invention will be described with reference to the drawings. The present invention is not limited to the embodiments described below.

Figure 1A:
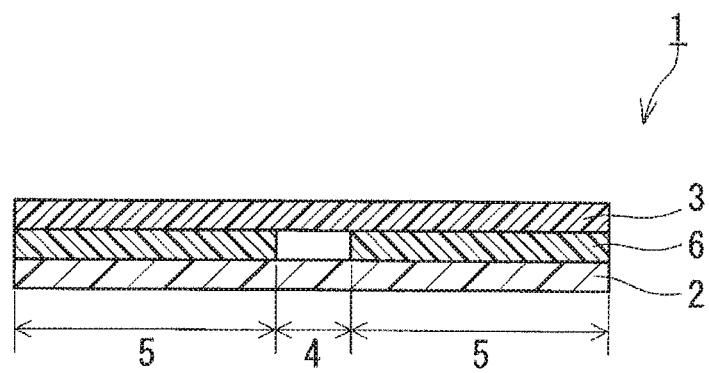
FIG. 1A is a cross-sectional view schematically showing an example of a waterproof sound-transmitting member that is a kind of the waterproof member of the present invention.
Figure 1B:
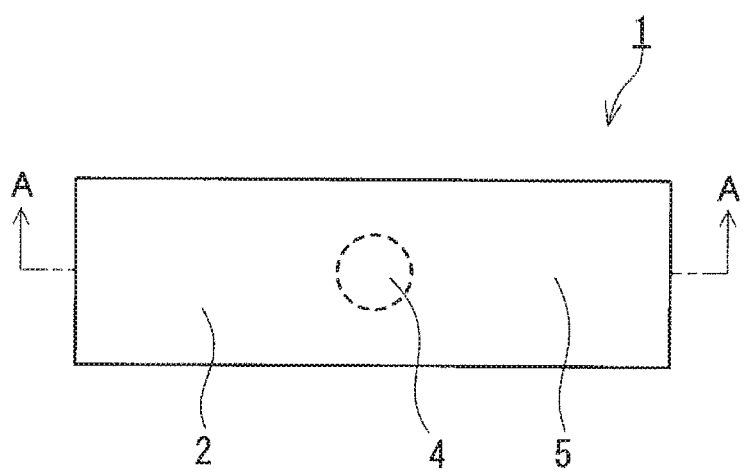
FIG. 1B is a plan view of the waterproof sound-transmitting member shown in FIG. 1A as seen from the waterproof sound-transmitting membrane side.

FIG. 1A and FIG. 1B show an example of the waterproof sound-transmitting member of the present invention. FIG. 1A shows a cross-section A-A shown in FIG. 1B. FIG. 1B shows a waterproof sound-transmitting member 1 as seen from the waterproof sound-transmitting membrane 2 side.

The waterproof sound-transmitting member 1 has a joining region 5 where a waterproof sound-transmitting membrane 2 and a support layer 3 are joined, and a non-joining region 4 surrounded by the joining region 5 when viewed in a direction perpendicular to a main surface of the waterproof sound-transmitting membrane 2 (see FIG. 1B). The joining region 5 includes regions of peripheral portions of the waterproof sound-transmitting membrane 2 and the support layer 3. The waterproof sound-transmitting membrane 2 and the support layer 3 are joined by a joining portion 6.

As shown in FIG. 1A, in the non-joining region 4, the support layer 3 is spaced apart from the waterproof sound-transmitting membrane 2. The support layer 3 has air permeability in the thickness direction thereof. The thickness of the support layer 3 in the non-joining region 4 is 500 µm or less. That is, in the non-joining region 4, the support layer 3 having air permeability in the thickness direction thereof and having a thickness of 500 µm or less is placed so as to be spaced apart from the waterproof sound-transmitting membrane 2. In addition, the spacing distance between the waterproof sound-transmitting membrane 2 and the support layer 3 in the non-joining region 4 is 150 µm or less. Moreover, in the waterproof sound-transmitting member 1, the air resistance in an in-plane direction of the support layer 3 is greater than 80,000 seconds/100 mL.

Figure 2:
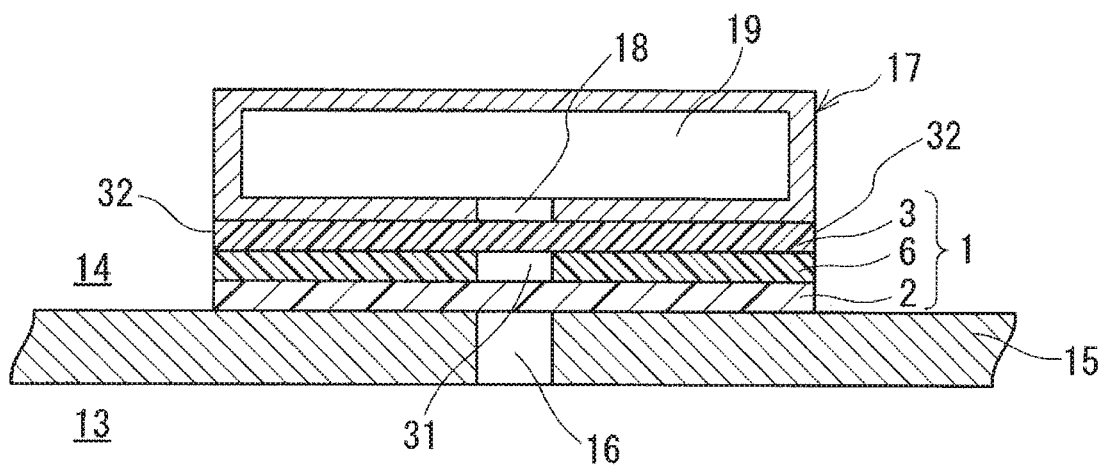
FIG. 2 is a cross-sectional view schematically showing an example of a state where the waterproof sound-transmitting member shown in FIG. 1A is attached to an external sound-transmitting port of a housing.

As shown in FIG. 2, the waterproof sound-transmitting member 1 can be attached to a housing 15 of an electronic device having an audio function. More specifically, the waterproof sound-transmitting member 1 can be attached to the housing 15 such that the waterproof sound-transmitting member 1 covers an external sound-transmitting port 16 of the housing 15 and such that the waterproof sound-transmitting membrane 2 side of the waterproof sound-transmitting member 1 faces an outside (external space) 13. In the waterproof sound-transmitting member 1 including the waterproof sound-transmitting membrane 2, it is possible to prevent entry of water into an inside 14 of the electronic device through the external sound-transmitting port 16 while allowing transmission of sound between the outside 13 and a sound converter 17 included in the electronic device. In the example shown in FIG. 2, the waterproof sound-transmitting member 1 is attached to the housing 15 such that the support layer 3 is in contact with the sound converter 17 having a sound-transmitting port (internal sound-transmitting port) 18. The non-joining region 4, the external sound-transmitting port 16, and the internal sound-transmitting port 18 overlap each other when viewed in a direction perpendicular to a main surface of the waterproof sound-transmitting membrane 2.

When water pressure is applied to the external sound-transmitting port 16 of the electronic device to which the waterproof sound-transmitting member 1 is attached, the waterproof sound-transmitting membrane 2 becomes deformed in the direction to the support layer 3 (the direction from the outside 13 toward the inside 14 of the housing) in the non-joining region 4. However, in the waterproof sound-transmitting member 1, the deformation of the waterproof sound-transmitting membrane 2 is limited in a certain range. The limitation of the deformation of the waterproof sound-transmitting membrane 2 is mainly based on the magnitude of the air resistance in the in-plane direction of the support layer 3. The deformation of the waterproof sound-transmitting membrane 2 in the direction to the support layer 3 reduces the volume of a space 31 between the waterproof sound-transmitting membrane 2 and the support layer 3 in the non-joining region 4 and increases the pressure in the space 31. The increased pressure in the space 31 serves as a cushioning material (air cushion) that inhibits the deformation of the waterproof sound-transmitting membrane 2 in the direction to the support layer 3. When the air resistance in the in-plane direction of the support layer 3 (in other words, the air resistance of air that tries to pass between the inside and the outside of the support layer 3 on an outer peripheral side surface 32 of the support layer 3 in a state where the support layer 3 is incorporated in the waterproof sound-transmitting member 1) is high, gas in the space 31 is less likely to pass through the inside of the support layer 3 in the direction to the outer peripheral side surface 32, and the increased pressure is more reliably maintained in the space 31. Note that in a state where water pressure is applied to the waterproof sound-transmitting membrane 2, the gas in the space 31 cannot pass through the waterproof sound-transmitting membrane 2 in a direction to the external sound-transmitting port 16. In addition, an internal space 19 of the sound converter 17 connected to the space 31 via the support layer 3, which has air permeability in the thickness direction thereof, and the internal sound-transmitting port 18 is normally a closed space. Therefore, the air resistance in the in-plane direction of the support layer 3 greatly affects maintaining the increased pressure in the space 31.

The deformation that remains in the waterproof sound-transmitting membrane 2 even after being released from the water pressure (hereinafter, referred to as "permanent deformation") also decreases the sound transmission characteristics of the waterproof sound-transmitting member 1. The support layer 3 can reduce the permanent deformation of the waterproof sound-transmitting membrane 2 by limiting deformation of the waterproof sound-transmitting membrane 2.

Moreover, in the waterproof sound-transmitting member 1, even when high water pressure that causes deformation to progress beyond the limit of the space 31 in which the pressure is increased is applied to the waterproof sound-transmitting membrane 2, the deformation of the waterproof sound-transmitting membrane 2 is limited in a certain range by contact between the deformed waterproof sound-transmitting membrane 2 and the support layer 3, thereby preventing breakage of the sound-transmitting membrane 2. Therefore, since the waterproof sound-transmitting member 1 includes the support layer 3, the waterproof sound-transmitting member 1 can have waterproofness (for example, limit water entry pressure) higher than the waterproofness of the waterproof sound-transmitting membrane 2.

The thickness of the support layer 3 in the non-joining region 4 is 500 μm or less. Accordingly, in the waterproof sound-transmitting member 1, it is possible to ensure good sound transmission characteristics even though the support layer 3 is included. That is, even when the waterproof sound-transmitting member 1 is attached, deterioration of sound resulting from conversion (to be converted) by the sound converter can be inhibited. The thickness of the support layer 3 may be 300 μm or less, 250 μm or less, 200 μm or less, 150 μm or less, or even 100 μm or less. The lower limit of the thickness of the support layer 3 in the non-joining region 4 is, for example, 30 μm or more and may be 50 μm or more. The support layer 3 may have the above thickness without being limited to the non-joining region 4. The entirety of the support layer 3 may have the above thickness.

The spacing distance between the waterproof sound-transmitting membrane 2 and the support layer 3 in the non-joining region 4 is 150 μm or less. Accordingly, deformation and permanent deformation of the waterproof sound-transmitting membrane 2 due to water pressure can be inhibited more reliably. In addition, when the spacing distance is 150 μm or less, it is possible to ensure good sound transmission characteristics even though the support layer 3 is included. The spacing distance may be 125 μm or less, 100 μm or less, 75 μm or less, or even 50 μm or less. The lower limit of the spacing distance is, for example, 5 μm or more, and may be 10 μm or more, 20 μm or more, or even 30 μm or more.

The air resistance in the in-plane direction of the support layer 3 may be 100,000 seconds/100 mL or more, 150,000 seconds/100 mL or more, 200,000 seconds/100 mL or more, 250,000 seconds/100 mL or more, or 300,000 seconds/100 mL or more, and may be greater than 300,000 seconds/100 mL. The upper limit of the air resistance in the in-plane direction of the support layer 3 is, for example, 1,000,000 seconds/100 mL. The air resistance in the in-plane direction of the support layer 3 can be evaluated as an air resistance between a portion, located in the non-joining region 4, of the main surface of the support layer 3 in a state where the support layer 3 is incorporated in the waterproof sound-transmitting member 1 and the outer peripheral side surface 32 of the support layer 3.

The waterproof sound-transmitting member 1 can be attached between the external sound-transmitting port (external sound-transmitting port) 16 provided in the housing 15 and the sound-transmitting port (internal sound-transmitting port) 18 of the sound converter 17 such that the surface of the waterproof sound-transmitting member 1 at the support layer 3 side covers the internal sound-transmitting port 18 and the surface of the waterproof sound-transmitting member 1 at the waterproof sound-transmitting membrane 2 side covers the external sound-transmitting port 16.

In the example shown in FIG. 1A and FIG. 1B, the waterproof sound-transmitting member 1 is rectangular, and the non-joining region 4 is circular, when viewed in the direction perpendicular to the main surface of the waterproof sound-transmitting membrane 2. However, the shapes of the waterproof sound-transmitting member 1 and the non-joining region 4 are not limited to the above example. The shapes of the waterproof sound-transmitting member 1 and the non-joining region 4 may be, independently of each other, a circle (including a substantially circular shape), an ellipse (including a substantially elliptical shape), and a polygon including a rectangle and a square. The corners of the polygon may be rounded.

The shape of the joining region 5 is not limited as long as the shape is a shape surrounding the non-joining region 4. The joining region 5 is typically a region including the peripheral portion of the waterproof sound-transmitting membrane 2 and/or the support layer 3. In the example shown in FIG. 1A and FIG. 1B, the region other than the joining region 5 where the waterproof sound-transmitting membrane 2 and the support layer 3 are joined is the non-joining region 4. In the example shown in FIG. 1A and FIG. 1B, in the non-joining region 4, the waterproof sound-transmitting membrane 2 is exposed on one surface of the waterproof sound-transmitting member 1. In addition, in the non-joining region 4, the support layer 3 is exposed on the other surface of the waterproof sound-transmitting member 1.

The waterproof sound-transmitting member 1 can exhibit high sound transmission characteristics even though the waterproof sound-transmitting member 1 has the non-joining region 4 having a reduced area. The area of the non-joining region 4 when viewed in the direction perpendicular to the main surface of the waterproof sound-transmitting membrane 2 is, for example, 12 mm$^2$ or less. The area of the non-joining region 4 may be 10 mm$^2$ or less, 8.0 mm$^2$ or less, 5.0 mm$^2$ or less, 3.2 mm$^2$ or less, 2.0 mm$^2$ or less, or even 1.8 mm$^2$ or less. The lower limit of the area of the non-joining region 4 is not limited, and is, for example, 0.02 mm$^2$ or more. The waterproof sound-transmitting member 1 is suitable for use for a small-size electronic device having an audio function. An example of the small-size electronic device is a wearable device such as a smart watch.

The proportion of the area of the non-joining region 4 to the sum of the area of the joining region 5 and the area of the non-joining region 4 when viewed in the direction perpendicular to the main surface of the waterproof sound-transmitting membrane 2 is not limited, and is, for example, 1 to 90%. The upper limit of the proportion may be 50% or less, 20% or less, 15% or less, or even 10% or less. As the proportion decreases, that is, as the proportion of the joining region 5 in the waterproof sound-transmitting member 1 increases, the waterproof sound-transmitting membrane 2 and the support layer 3 can be more firmly joined. Thus, as the proportion decreases, the degree of deformation and permanent deformation of the waterproof sound-transmitting membrane 2 due to water pressure can be reduced more, so that the waterproofness of the waterproof sound-transmitting member 1 can be increased further, and a decrease in the sound transmission characteristics of the waterproof sound-transmitting member 1 due to water pressure can be inhibited more reliably.

The shape of the waterproof sound-transmitting membrane 2 and the shape of the support layer 3 may be the same or different from each other, when viewed in the direction perpendicular to the main surface of the waterproof sound-transmitting membrane 2. In the example shown in FIG. 1A and FIG. 1B, the shape of the waterproof sound-transmitting membrane 2 and the shape of the support layer 3 are the same and are also the same as that of the waterproof sound-transmitting member 1.

The thickness of the waterproof sound-transmitting member 1 is, for example, 2000 μm or less. The thickness of the waterproof sound-transmitting member 1 may be 1000 μm or less, 750 μm or less, 600 μm or less, 500 μm or less, 400 μm or less, or even 300 μm or less. The lower limit of the thickness of the waterproof sound-transmitting member 1 is, for example, 50 μm or more. The waterproof sound-transmitting member 1 is suitable for use in a small-size electronic device for which the volume of the interior of a housing is limited. In addition, in an electronic device having an audio function, as the distance from an external sound-transmitting port to a sound converter increases, sound resulting from conversion (to be converted) by the sound converter tends to be deteriorated. The deterioration of the sound becomes particularly strong when the sound converter is a sound receiving unit such as a microphone, or when the area of the external sound-transmitting port and/or the internal sound-transmitting port is small. When the thickness of the waterproof sound-transmitting member 1 is within the above range, the distance from the external sound-transmitting port to the internal sound-transmitting port does not become excessively large even if the waterproof sound-transmitting member 1 is placed. Therefore, the deterioration of the sound resulting from conversion (to be converted) by the sound converter can be inhibited.

Examples of the material forming the support layer 3 include metals, resins, and composite materials thereof. The material forming the support layer 3 is preferably a metal since the strength of the support layer 3 becomes excellent. Examples of the metals include aluminum and stainless steel. Examples of the resins include various resins such as polyolefins (polyethylene, polypropylene, etc.), polyesters (polyethylene terephthalate (PET), etc.), polyamides (various aliphatic polyamides and aromatic polyamides including nylon, etc.), polycarbonates, and polyimides.

A specific example of the support layer 3 is a metal plate having one or more through holes connecting one main surface and the other main surface thereof. The support layer 3 that is the metal plate has particularly excellent strength. Thus, in the waterproof sound-transmitting member 1 including the support layer 3 that is the metal plate, deformation and permanent deformation of the waterproof sound-transmitting membrane 2 due to water pressure can be inhibited more reliably. In addition, in the case where the support layer 3 is the metal plate, the rigidity and handleability of the waterproof sound-transmitting member 1 can be improved. The through holes extend, for example, in the thickness direction of the support layer 3. A metal plate having two or more through holes is preferable since the waterproof sound-transmitting member 1 that exhibits both sound transmission characteristics and strength at a higher level is obtained. The through holes may be present at least in a portion located in the non-joining region 4.

In the case of having two or more through holes, when viewed from a direction perpendicular to a main surface of the metal plate, the openings of the respective through holes may be regularly arranged on the main surface or may be irregularly located on the main surface.

Each of the shapes of the openings of the through holes is, for example, a circle (including a substantially circular shape), an ellipse (including a substantially elliptical shape), and a polygon including a square and a rectangle, when viewed from the direction perpendicular to the main surface of the metal plate. The corners of the polygon may be rounded. However, each of the shapes of the openings of the through holes is not limited to the above example. In the case of having two or more through holes, the shapes of the openings of the respective through holes may be the same or different.

An example of the metal plate having two or more through holes is a perforated metal. The perforated metal is a metal plate in which through holes are provided by punching (press punching).

The opening ratio of the support layer 3 that is the above metal plate is, for example, 5 to 80%, and may be 15 to 40% or even 15 to 30%. When the opening ratio is within these ranges, the waterproof sound-transmitting member 1 that exhibits both sound transmission characteristics and strength at a higher level can be obtained. The opening ratio of the support layer 3 that is the metal plate is the proportion of the areas of the openings of all the through holes present on the main surface of the support layer 3 to the area of the main surface.

Another example of the support layer 3 is a mesh or a net formed from a metal, a resin, or a composite material thereof.

The air permeability in the thickness direction of the support layer 3 is normally higher than the air permeability in the thickness direction of the waterproof sound-transmitting membrane 2. The air permeability in the thickness direction of the support layer 3 is, for example, 10 cm$^3$/(cm$^2$·sec) or more, and may be 100 cm$^3$/(cm$^2$·sec) or more, 300 cm³/(cm²·sec) or more, or even greater than 500 cm³/(cm²·sec), as represented by an air permeability (Frazier air permeability) obtained according to Method A (Frazier method) of air permeability measurement specified in Japanese Industrial Standards (hereinafter, referred to as "JIS") L1096: 2010. The upper limit of the air permeability in the thickness direction of the support layer 3 is, for example, 1000 cm³/(cm²·sec) or less as represented by the Frazier air permeability.

Even when the size of the support layer 3 does not satisfy the test piece size (about 200 mm×200 mm) in the Frazier method, it is possible to evaluate the Frazier air permeability by using a measurement jig that limits the area of a measurement region. An example of the measurement jig is a resin plate that has a through hole formed at the center thereof and having a cross-sectional area corresponding to the area of a desired measurement region. For example, a measurement jig that has a through hole formed at the center thereof and having a circular cross-section with a diameter of 1 mm or less can be used.

The strength of the support layer 3 is normally higher than the strength of the waterproof sound-transmitting membrane 2.

Figure 3A:
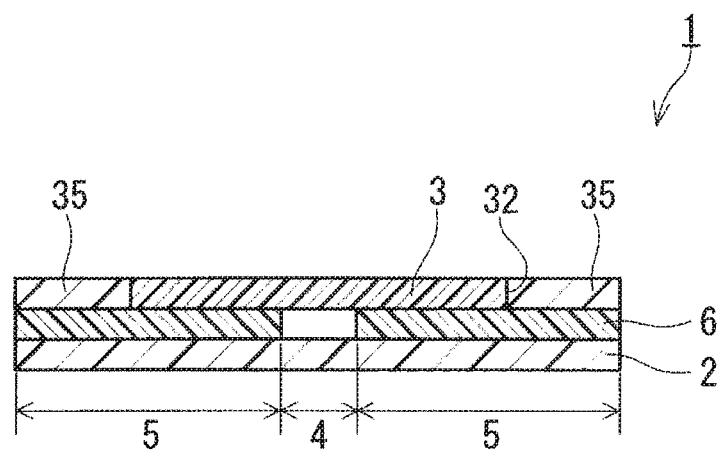
FIG. 3A is a cross-sectional view schematically showing another example of the waterproof sound-transmitting member that is a kind of the waterproof member of the present invention.
Figure 3B:
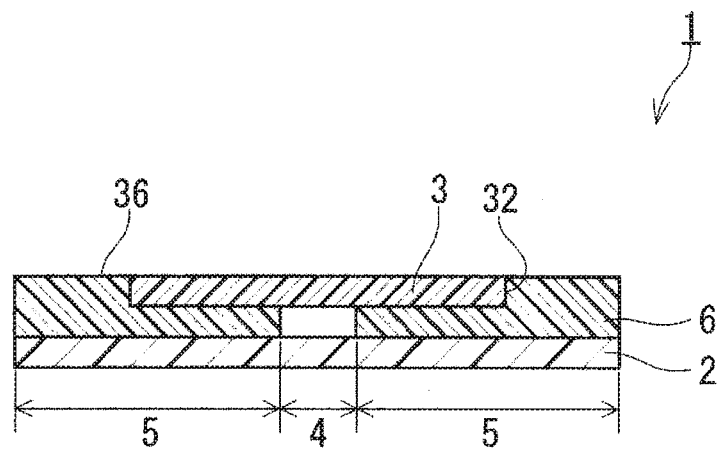
FIG. 3B is a cross-sectional view schematically showing still another example of the waterproof sound-transmitting member that is a kind of the waterproof member of the present invention.

FIG. 3A and FIG. 3B each show another example of the waterproof sound-transmitting member of the present invention. In the example of FIG. 3A, the outer peripheral side surface 32 of the support layer 3 is covered with an air-impermeable layer 35. The support layer 3 and the air-impermeable layer 35 are placed on the joining portion 6. When viewed from the direction perpendicular to the main surface of the waterproof sound-transmitting membrane 2, the support layer 3 has a shape having an area smaller than that of the waterproof sound-transmitting membrane 2 and is surrounded by the air-impermeable layer 35. When viewed from the above direction, the outer circumference of the air-impermeable layer 35 and the outer circumference of the waterproof sound-transmitting membrane 2 coincide with each other. In a state where the air-impermeable layer 35 is removed, the air resistance in the in-plane direction of the support layer 3 may be less than or within the above range. In this case as well, by placing the air-impermeable layer 35, the air resistance in the in-plane direction of the support layer 3 can be ensured within the above range. The air-impermeable layer 35 contains, for example, a resin. The air-impermeable layer 35 may be a non-porous layer, or may be a pressure-sensitive adhesive layer or an adhesive layer. In the example of FIG. 3A, the entirety of the outer peripheral side surface 32 of the support layer 3 is covered with the air-impermeable layer 35, but only a part of the outer peripheral side surface 32 may be covered with the air-impermeable layer 35 as long as the air resistance in the in-plane direction of the support layer 3 is within the above range.

The example of FIG. 3B is another example in which the outer peripheral side surface 32 of the support layer 3 is covered with the air-impermeable layer 35. In this example, the outer peripheral side surface 32 of the support layer 3 is covered with the joining portion 6. The support layer 3 is embedded in an upper surface 36 of the joining portion 6. The support layer 3 is surrounded by the joining portion 6 when viewed from the direction perpendicular to the main surface of the waterproof sound-transmitting membrane 2.

The waterproof sound-transmitting membrane 2 is a membrane that prevents entry of water while permitting sound to pass therethrough. Various known waterproof sound-transmitting membranes can be used as the waterproof sound-transmitting membrane 2. The waterproof sound-transmitting membrane 2 may be subjected to an oil repellent treatment or a liquid repellent treatment.

The waterproof sound-transmitting membrane 2 is formed from a resin such as a polyester (PET, etc.), a polycarbonate, a polyethylene, a polyimide, PTFE, and a polyurethane. As the material of the waterproof sound-transmitting membrane 2, PTFE is suitable. A membrane formed from PTFE (PTFE membrane) has good balance between mass and strength.

The PTFE membrane may be a porous membrane (porous PTFE membrane) formed by stretching a cast membrane or a paste extrusion containing PTFE particles. The PTFE membrane may be sintered.

When the electronic device to which the waterproof sound-transmitting member 1 is attached is expected to be exposed to higher water pressure, the waterproof sound-transmitting membrane 2 is preferably a microporous membrane or a non-porous membrane. Both the microporous membrane and the non-porous membrane can have a higher water entry pressure and have a lower degree of deformation due to water pressure. The microporous membrane may be a microporous PTFE membrane formed from PTFE. The non-porous membrane may be a non-porous PTFE membrane formed from PTFE.

In the present description, the microporous membrane refers to a membrane having an air permeability, in the thickness direction thereof, of 20 seconds/100 mL or more and 10,000 seconds/100 mL or less as represented by an air permeability (Gurley air permeability) obtained according to Method B (Gurley method) of air permeability measurement specified in JIS L1096: 2010. The lower limit of the Gurley air permeability of the microporous membrane may be greater than 30 seconds/100 mL, and may be 40 seconds/100 mL or more, 50 seconds/100 mL or more, or even 70 seconds/100 mL or more. The upper limit of the Gurley air permeability of the microporous membrane may be 5000 seconds/100 mL or less, 1000 seconds/100 mL or less, or even 300 seconds/100 mL or less. In the present description, the non-porous membrane refers to a membrane having an air permeability, in the thickness direction thereof, greater than 10,000 seconds/100 mL as represented by the Gurley air permeability.

Even when the size of the waterproof sound-transmitting membrane 2 does not satisfy the test piece size (about 50 mm×50 mm) in the Gurley method, it is possible to evaluate the Gurley air permeability by using a measurement jig. An example of the measurement jig is a polycarbonate disc provided with a through hole (having a circular cross section with a diameter of 1 mm or 2 mm) at the center thereof and having a thickness of 2 mm and a diameter of 47 mm. Measurement of a Gurley air permeability using the measurement jig can be performed as follows.

A waterproof sound-transmitting membrane to be evaluated is fixed to one surface of the measurement jig so as to cover the opening of the through hole of the measurement jig. The fixation is performed such that, during measurement of a Gurley air permeability, air passes through only the opening and an effective test portion (portion overlapping the opening when viewed in a direction perpendicular to a main surface of the fixed waterproof sound-transmitting membrane) of the waterproof sound-transmitting membrane to be evaluated, and the fixed portion of the waterproof sound-transmitting membrane does not hinder passing of air through the effective test portion of the waterproof sound-transmitting membrane. For fixing the waterproof sound-transmitting membrane, a double-faced adhesive tape having a ventilation port punched in a center portion thereof with a shape that matches the shape of the opening can be used. The double-faced adhesive tape can be placed between the measurement jig and the waterproof sound-transmitting membrane such that the circumference of the ventilation port and the circumference of the opening coincide with each other. Next, the measurement jig having the waterproof sound-transmitting membrane fixed thereto is set on a Gurley air permeability testing machine such that the surface on which the waterproof sound-transmitting membrane is fixed is at the downstream side of airflow during measurement, and a time t1 taken for 100 mL of air to pass through the waterproof sound-transmitting membrane is measured. Next, the measured time t1 is converted into a value t per effective test area of 642 [mm$^2$] specified in Method B (Gurley method) of air permeability measurement in JIS L1096: 2010, by the equation t={(t1)×(area of effective test portion of waterproof sound-transmitting membrane [mm$^2$])/642 [mm$^2$]}, and the obtained conversion value t can be regarded as the Gurley air permeability of the waterproof sound-transmitting membrane. When the above disc is used as the measurement jig, the area of the effective test portion of the waterproof sound-transmitting membrane is the area of a cross section of the through hole. It has been confirmed that the Gurley air permeability measured without using the measurement jig for a waterproof sound-transmitting membrane satisfying the above test piece size and the Gurley air permeability measured using the measurement jig after fragmenting the waterproof sound-transmitting membrane coincide well with each other, that is, the use of the measurement jig does not substantially affect the measured values of the Gurley air permeability.

Condensation may occur inside the housing when the temperature of the housing decreases due to, for example, use, mounting or wearing of the electronic device in water. The occurrence of condensation can be prevented by reducing the amount of water vapor staying inside the housing. In the case where the waterproof sound-transmitting membrane 2 is a non-porous membrane, for example, a non-porous PTFE membrane, entry of water vapor into the housing through the waterproof sound-transmitting membrane 2 is prevented. Therefore, by selecting a non-porous membrane as the waterproof sound-transmitting membrane 2, the amount of water vapor staying inside the housing can be reduced, so that occurrence of condensation inside the housing can be prevented.

Meanwhile, even if water vapor does not enter the inside of the housing through the waterproof sound-transmitting membrane 2, retention of water vapor inside the housing is unavoidable in some cases. Such a case is, for example, the case where the housing is formed from a resin having hygroscopicity, such as polybutylene terephthalate (PBT), acrylonitrile-butadiene-styrene resin (ABS), polymethyl methacrylate (PMMA), polypropylene (PP), or polycarbonate (PC). In the housing formed from a resin having hygroscopicity, external water vapor absorbed by the housing itself tends to be released to the inside of the housing by heat from a heat source inside the housing and stay inside the housing. In this case, to prevent occurrence of condensation in the housing, it is preferable to select the waterproof sound-transmitting membrane 2 capable of releasing water vapor staying inside the housing to the outside. An example of the selectable waterproof sound-transmitting membrane 2 is a microporous membrane, and the selectable waterproof sound-transmitting membrane 2 is, for example, a microporous PTFE membrane. When the waterproof sound-transmitting membrane 2 is a microporous membrane, it is possible to discharge retained water vapor to the outside due to the appropriate air permeability of the waterproof sound-transmitting membrane 2 even though high waterproofness is achieved, so that occurrence of condensation inside the housing can be prevented.

The average pore diameter of the waterproof sound-transmitting membrane 2 that is a microporous PTFE membrane is, for example, 0.01 to 1 μm. The porosity of the waterproof sound-transmitting membrane 2 that is a microporous PTFE membrane is, for example, 5 to 50%. The average pore diameter of the PTFE membrane can be measured according to American Society for Testing and Materials (ASTM) F316-86. The porosity of the PTFE membrane can be calculated by substituting the mass, the thickness, the area (area of a main surface), and the true density of the membrane into the following equation. The true density of PTFE is 2.18 g/cm$^3$.

$$\text{Porosity } (\%) = \{1 - (\text{mass [g]}/(\text{thickness [cm]} \times \text{area [cm}^2\text{]} \times \text{true density [2.18 g/cm}^3\text{]}))\} \times 100$$

The thickness of the waterproof sound-transmitting membrane 2 is, for example, 1 to 50 μm. The thickness of the waterproof sound-transmitting membrane 2 may be 3 to 30 μm or 5 to 20 μm. When the thickness is within these ranges, the waterproofness and the sound transmission characteristics of the waterproof sound-transmitting membrane 2 can be improved in a well-balanced manner.

The surface density of the waterproof sound-transmitting membrane 2 is, for example, 1 to 30 g/m$^2$. The surface density of the waterproof sound-transmitting membrane 2 may be 1 to 25 g/m$^2$. The surface density can be calculated by dividing the mass of the waterproof sound-transmitting membrane 2 by the area (area of a main surface) of the waterproof sound-transmitting membrane 2.

The waterproofness of the waterproof sound-transmitting membrane 2 can be evaluated on the basis of water entry pressure (limit water entry pressure). The water entry pressure of the waterproof sound-transmitting membrane 2 is, for example, 80 kPa or more. The water entry pressure of the waterproof sound-transmitting membrane 2 may be 100 kPa or more, 300 kPa or more, 500 kPa or more, 600 kPa or more, 700 kPa or more, 750 kPa or more, 800 kPa or more, 900 kPa or more, or even 1000 kPa or more. The upper limit of the water entry pressure is not limited, and is, for example, 2000 kPa or less. The water entry pressure of the waterproof sound-transmitting membrane 2 can be measured as follows according to Method A (low water pressure method) or Method B (high water pressure method) of the water resistance test in JIS L1092: 2009 using a measurement jig.

An example of the measurement jig is a stainless disc having a diameter of 47 mm and provided with a through hole (having a circular cross section) having a diameter of 1 mm at the center thereof. The disc has a thickness sufficient to prevent the disc from deforming due to the water pressure applied upon measurement of a water entry pressure. Measurement of a water entry pressure using the measurement jig can be performed as follows.

A waterproof sound-transmitting membrane to be evaluated is fixed to one surface of the measurement jig so as to cover the opening of the through hole of the measurement jig. The fixation is performed such that, during measurement of a water entry pressure, water does not leak from a fixed portion of the membrane. For fixing the waterproof sound-transmitting membrane, a double-faced adhesive tape having a water port punched in a center portion thereof with a shape that matches the shape of the opening can be used. The double-faced adhesive tape can be placed between the measurement jig and the waterproof sound-transmitting membrane such that the circumference of the water port and the circumference of the opening coincide with each other. Next, the measurement jig having the waterproof sound-transmitting membrane fixed thereto is set on a testing device such that the surface opposite to the membrane-fixed surface of the measurement jig is a water pressure application surface to which water pressure is applied during measurement, and a water entry pressure is measured according to Method A (low water pressure method) or Method B (high water pressure method) of the water resistance test in JIS L1092: 2009. The water entry pressure is measured on the basis of the water pressure when water comes out from one spot on the membrane surface of the waterproof sound-transmitting membrane. The measured water entry pressure can be regarded as the water entry pressure of the waterproof sound-transmitting membrane. As the testing device, a device that has the same configuration as the water resistance testing device exemplified in JIS L1092: 2009 and that has a test piece attachment structure capable of setting the measurement jig can be used.

The sound transmission characteristics of the waterproof sound-transmitting membrane 2 can be evaluated on the basis of insertion loss at 1 kHz (insertion loss for sound having a frequency of 1 kHz). The insertion loss at 1 kHz of the waterproof sound-transmitting membrane 2 is, for example, 17 dB or less, and can be 13 dB or less, 10 dB or less, 8 dB or less, 7 dB or less, or even 6 dB or less, when the area of the sound-transmission region of the membrane is 1.8 mm².

The sound transmission characteristics of the waterproof sound-transmitting membrane 2 can also be evaluated on the basis of insertion loss at 200 Hz (insertion loss for sound having a frequency of 200 Hz). The insertion loss at 200 Hz of the waterproof sound-transmitting membrane 2 is, for example, 13 dB or less, and can be 11 dB or less, 10 dB or less, or even 8 dB or less, when the area of the sound-transmission region of the membrane is 1.8 mm².

Regarding the waterproof sound-transmitting membrane 2, the degree of decrease in sound transmission characteristics due to water pressure can be evaluated on the basis of the sound transmission characteristics decrease rate (insertion loss change rate) obtained from the insertion losses of the waterproof sound-transmitting membrane 2 before and after a water pressure retention test. The water pressure retention test is a test in which a constant water pressure is applied to a waterproof sound-transmitting membrane for a fixed time (water pressure application time). The water pressure retention test can be performed using the measurement jig and the water resistance testing device for measuring the water entry pressure of a waterproof sound-transmitting membrane. More specifically, similar to the case of measuring a water entry pressure, the measurement jig having the waterproof sound-transmitting membrane fixed thereto may be set on the testing device such that the surface opposite to the membrane-fixed surface of the measurement jig is a water pressure application surface, and a constant water pressure may be applied to the waterproof sound-transmitting membrane for a fixed time. In the case of evaluating whether water leakage occurs at the waterproof sound-transmitting membrane during the test, if water comes out from one spot on the membrane surface of the waterproof sound-transmitting membrane, it is determined that "water leakage occurs". The water pressure applied to the waterproof sound-transmitting membrane during the test is not limited, and is, for example, 50 kPa to 1000 kPa. The water pressure application time is, for example, 10 to 30 minutes. The sound transmission characteristics decrease rate can be determined by the following equation. In the following equation, L1 is the insertion loss (for example, insertion loss at 1 kHz) of the waterproof sound-transmitting membrane before the test, and L2 is the insertion loss (for example, insertion loss at 1 kHz) of the waterproof sound-transmitting membrane after the test.

Sound transmission characteristics decrease rate
[%]=(L2−L1)/L1×100      Equation:

The sound transmission characteristics decrease rate of the waterproof sound-transmitting membrane 2 obtained from the insertion losses before and after the water pressure retention test (water pressure: 500 kPa, water pressure application time: 10 minutes) (calculated on the basis of insertion loss at 1 kHz) is, for example, 50% or less, and can be 40% or less, 30% or less, or even 25% or less.

In the example shown in FIG. 1A and FIG. 1B, the waterproof sound-transmitting membrane 2 is a single-layer membrane. The waterproof sound-transmitting membrane 2 may be a laminate of two or more membranes. The waterproof sound-transmitting membrane 2 may be a laminate of two or more PTFE membranes.

The waterproof sound-transmitting membrane 2 may be a colored membrane. The waterproof sound-transmitting membrane 2 may be colored, for example, in gray or black. The gray or black waterproof sound-transmitting membrane 2 can be formed, for example, by mixing a gray or black coloring agent with the material forming the membrane. The black coloring agent is, for example, carbon black. A color in the range of 1 to 4 and a color in the range of 5 to 8 as represented by "achromatic color brightness NV" defined in JIS Z8721: 1993 can be defined as "black" and "gray", respectively.

The joining portion 6 is, for example, a pressure-sensitive adhesive layer or an adhesive layer. However, the configuration of the joining portion 6 is not limited as long as the joining region 5 and the non-joining region 4 can be formed. The joining portion 6 that is a pressure-sensitive adhesive layer or an adhesive layer can be formed, for example by applying a known pressure-sensitive adhesive or a known adhesive to the surface of the waterproof sound-transmitting membrane 2. The joining portion 6 may be composed of a double-faced adhesive tape. That is, in the joining region 5, the waterproof sound-transmitting membrane 2 and the support layer 3 may be joined by a double-faced adhesive tape. In the case where the joining portion 6 is composed of a double-faced adhesive tape, the waterproof sound-transmitting membrane 2 and the support layer 3 are joined more reliably, so that the waterproofness of the waterproof sound-transmitting member 1 can be further improved. In addition, the spacing distance between the waterproof sound-transmitting membrane 2 and the support layer 3 in the non-joining region 4 can be more easily controlled.

As the double-faced adhesive tape forming the joining portion 6, a known double-faced adhesive tape can be used. The substrate of the double-faced adhesive tape is, for example, a film, a nonwoven fabric, or a foam of a resin. The resin that can be used for the substrate are not limited, and examples of the resin include polyesters (PET, etc.), polyolefins (polyethylene, etc.), and polyimides. For the pressure-sensitive adhesive layer of the double-faced adhesive tape, various pressure-sensitive adhesives such as acrylic-based pressure-sensitive adhesives and silicone-based pressure-sensitive adhesives can be used. Acrylic-based pressure-sensitive adhesives are preferably used for the pressure-sensitive adhesive layer since the joining strength between the waterproof sound-transmitting membrane 2 and the support layer 3 can be improved. The double-faced adhesive tape may be a thermal adhesive tape.

The thickness of the joining portion 6 is, for example, 150 µm or less. The thickness of the joining portion 6 may be 125 µm or less, 100 µm or less, 75 µm or less, or even 50 µm or less. The lower limit of the thickness of the joining portion 6 is not limited, and is, for example, 5 µm or more, and may be 10 µm or more, 20 µm or more, or even 30 µm or more.

The waterproof sound-transmitting member 1 can be placed between a housing of an electronic device and a sound converter housed in the housing. The waterproof sound-transmitting member 1 is normally fixed to an inner wall surface of the housing so as to cover an external sound-transmitting port. In addition, the waterproof sound-transmitting member 1 can be fixed to a housing of the sound converter or the surface of a substrate having the sound converter so as to cover an internal sound-transmitting port. The positional relationship between: the external sound-transmitting port and the internal sound-transmitting port; and the non-joining region 4 of the waterproof sound-transmitting member 1 in the fixed state is not limited as long as sound can be transmitted between the outside and the sound converter. The external sound-transmitting port and the internal sound-transmitting port, and the non-joining region 4 in the fixed state may overlap each other when viewed in the direction perpendicular to the main surface of the waterproof sound-transmitting membrane 2.

The method for fixing the waterproof sound-transmitting member 1 to the housing and the sound converter is not limited. The waterproof sound-transmitting member 1 can be fixed to the housing and/or the sound converter by various kinds of welding such as heat welding, ultrasonic welding, and laser welding, or adhesion using a pressure-sensitive adhesive, an adhesive, or the like. It is also possible to fix the waterproof sound-transmitting member 1 by a fixing portion composed of a pressure-sensitive adhesive layer, an adhesive layer, or a double-faced adhesive tape. Among them, in the case where the fixing portion is composed of a double-faced adhesive tape, the waterproof sound-transmitting member 1 can be more reliably fixed to the housing and the sound converter. As the double-faced adhesive tape forming the fixing portion, the double-faced adhesive tape described above in the description of the joining portion 6 can be used. Regarding the waterproof sound-transmitting member 1 fixed to both the housing and the sound converter, the method for fixing to the housing and the method for fixing to the sound converter may be the same or different from each other.

Figure 4:
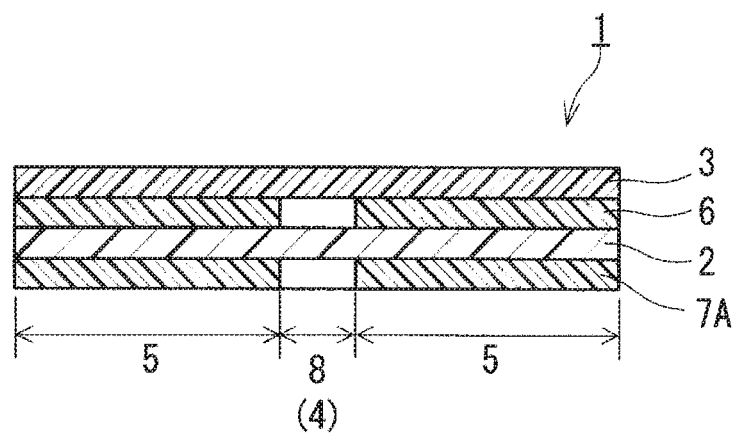
FIG. 4 is a cross-sectional view schematically showing still another example of the waterproof sound-transmitting member that is a kind of the waterproof member of the present invention.

FIG. 4 shows an example of the waterproof sound-transmitting member of the present invention further including a fixing portion 7A. In the waterproof sound-transmitting member 1 shown in FIG. 4, the fixing portion 7A is placed on the surface, of the waterproof sound-transmitting membrane 2, opposite to the surface, of the waterproof sound-transmitting membrane 2, joined to the support layer 3. The fixing portion 7A includes the region of the peripheral portion of the waterproof sound-transmitting membrane 2 when viewed in the direction perpendicular to the main surface of the waterproof sound-transmitting membrane 2. The fixing portion 7A has the same shape as the joining region 5 when viewed in the perpendicular direction. The fixing portion 7A has an opening 8 with a shape corresponding to the non-joining region 4, when viewed in the perpendicular direction. Sound is mainly transmitted through the opening 8 of the fixing portion 7A. The opening 8 is a sound-transmission region of the waterproof sound-transmitting membrane 2 and the waterproof sound-transmitting member 1. The opening 8 coincides with the non-joining region 4 when viewed in the perpendicular direction. The waterproof sound-transmitting member 1 shown in FIG. 4 can be fixed to the housing by the fixing portion 7A. The shape of the opening 8 of the fixing portion 7A may be the same as that of the external sound-transmitting port of the housing. In this case, the waterproof sound-transmitting member 1 can be fixed to the housing such that the circumference of the opening 8 and the circumference of the external sound-transmitting port coincide with each other when viewed in the perpendicular direction.

Figure 5:
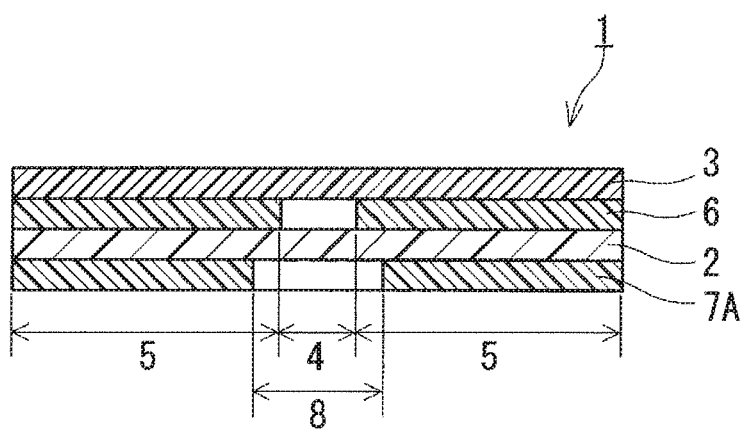
FIG. 5 is a cross-sectional view schematically showing still another example of the waterproof sound-transmitting member that is a kind of the waterproof member of the present invention.

FIG. 5 shows another example of the waterproof sound-transmitting member of the present invention further including the fixing portion 7A. The waterproof sound-transmitting member 1 shown in FIG. 5 is the same as the waterproof sound-transmitting member 1 shown in FIG. 4, except that the shape of the fixing portion 7A is different. The fixing portion 7A of the waterproof sound-transmitting member 1 shown in FIG. 5 has an opening 8 that is larger than the non-joining region 4 and overlaps the non-joining region 4 (more specifically, includes the non-joining region 4) when viewed in the perpendicular direction. Also, in the waterproof sound-transmitting member 1 shown in FIG. 5, the shape of the opening 8 of the fixing portion 7A may be the same as that of the external sound-transmitting port of the housing. In the waterproof sound-transmitting member 1 shown in FIG. 5, it is possible to make the area of the non-joining region 4 smaller than the area of the external sound-transmitting port. Thus, the waterproof performance of the electronic device to which the waterproof sound-transmitting member 1 is fixed can be further enhanced.

Figure 6A:
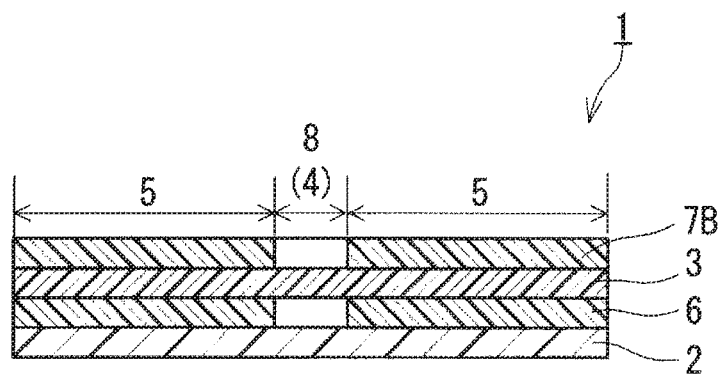
FIG. 6A is a cross-sectional view schematically showing still another example of the waterproof sound-transmitting member that is a kind of the waterproof member of the present invention.

FIG. 6A shows an example of the waterproof sound-transmitting member of the present invention further including a fixing portion 7B. In the waterproof sound-transmitting member 1 shown in FIG. 6A, the fixing portion 7B is placed on the surface, of the support layer 3, opposite to the surface, of the support layer 3, joined to the waterproof sound-transmitting membrane 2. The fixing portion 7B can have the same shape as the fixing portion 7A shown in FIG. 4 or FIG. 5 when viewed in the direction perpendicular to the main surface of the waterproof sound-transmitting membrane 2. The waterproof sound-transmitting member 1 shown in FIG. 6A can be fixed to the sound converter by the fixing portion 7B.

Figure 6B:
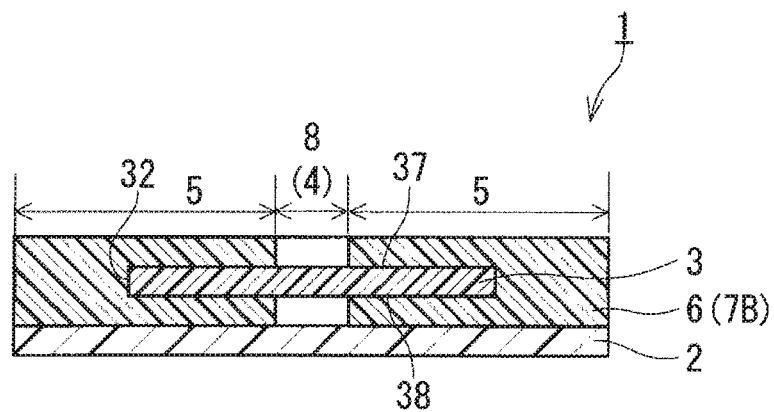
FIG. 6B is a cross-sectional view schematically showing still another example of the waterproof sound-transmitting member that is a kind of the waterproof member of the present invention.

FIG. 6B shows another example of further including the fixing portion 7B. In the waterproof sound-transmitting member 1 shown in FIG. 6B, the outer peripheral side surface 32 of the support layer 3, the surface (lower surface 38), of the support layer 3, joined to a protective membrane 2, and the surface (upper surface 37), of the support layer 3, opposite to the surface joined to the protective membrane 2, except for the portions facing the non-joining region 4 and the opening 8, are covered with the joining portion 6 and the fixing portion 7B. The joining portion 6 and the fixing portion 7B in FIG. 6B are integrated with each other, but do not have to be integrated with each other. The joining portion 6 and/or the fixing portion 7 may serve as the air-impermeable layer 35. The example of FIG. 6B is an example in which the outer peripheral side surface 32 of the support layer 3 is covered with the air-impermeable layer 35, and the upper surface 37 and/or the lower surface 38 of the support layer 3 is covered with the air-impermeable layer 35 having a shape surrounding the non-joining region 4 (and/or the opening 8) when viewed from the direction perpendicular to the main surface of the protective membrane 2. The shape of the air-impermeable layer 35 is not limited to the example of FIG. 6B.

Figure 7:
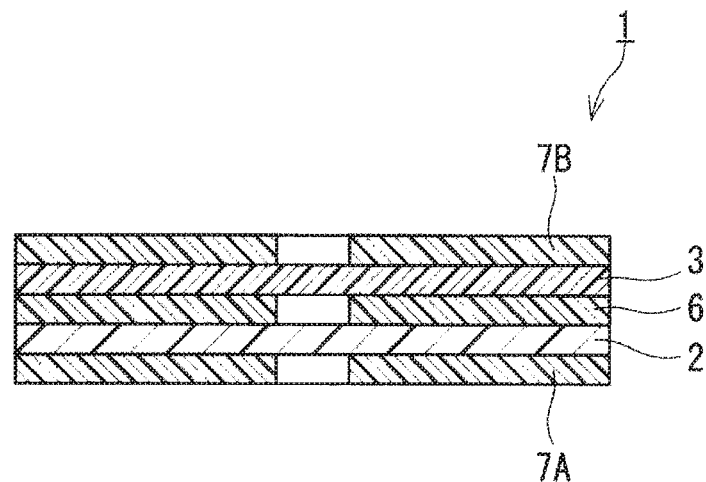
FIG. 7 is a cross-sectional view schematically showing still another example of the waterproof sound-transmitting member that is a kind of the waterproof member of the present invention.
Figure 8:
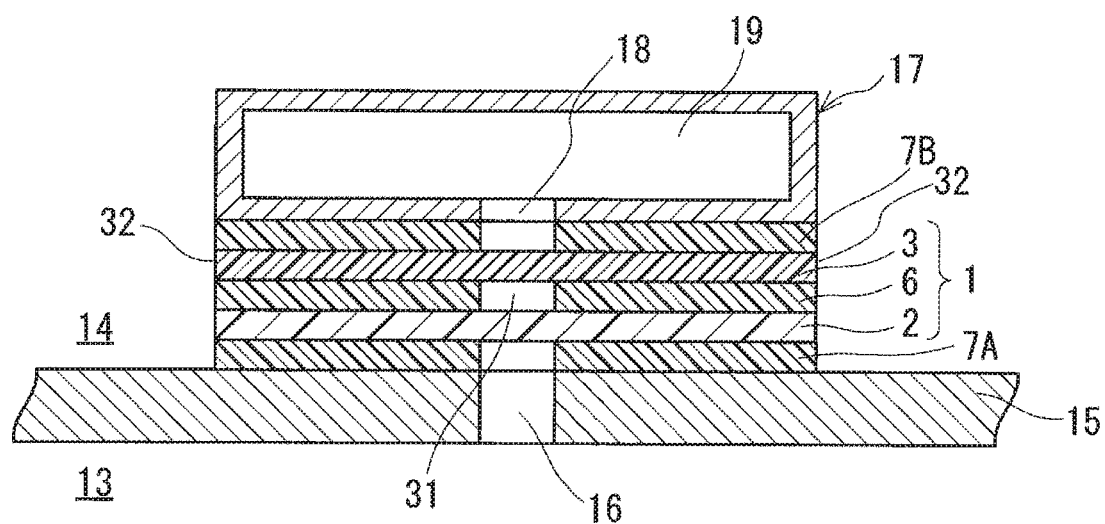
FIG. 8 is a cross-sectional view schematically showing an example of a state where the waterproof sound-transmitting member shown in FIG. 7 is attached to an external sound-transmitting port of a housing.

FIG. 7 shows an example of the waterproof sound-transmitting member of the present invention further including the fixing portions 7A and 7B. In the waterproof sound-transmitting member 1 shown in FIG. 7, the fixing portion 7A is placed on the surface, of the waterproof sound-transmitting membrane 2, opposite to the surface, of the waterproof sound-transmitting membrane 2, joined to the support layer 3. In addition, the fixing portion 7B is placed on the surface, of the support layer 3, opposite to the surface, of the support layer 3, joined to the waterproof sound-transmitting membrane 2. The fixing portions 7A and 7B can have the same shape as the fixing portion 7A shown in FIG. 4 or FIG. 5 when viewed in the direction perpendicular to the main surface of the waterproof sound-transmitting membrane 2. The shape of the fixing portion 7A and the shape of the fixing portion 7B may be the same or different from each other. The waterproof sound-transmitting member 1 shown in FIG. 7 can be fixed to the housing by the fixing portion 7A and can be fixed to the sound converter by the fixing portion 7B. FIG. 8 shows an example of a state where the waterproof sound-transmitting member 1 shown in FIG. 7 is attached to the housing 15 of the electronic device. The example shown in FIG. 8 is the same as the example shown in FIG. 2, except that the waterproof sound-transmitting member 1 is the waterproof sound-transmitting member 1 shown in FIG. 7, the waterproof sound-transmitting member 1 is fixed to the housing 15 by the fixing portion 7A, and the waterproof sound-transmitting member 1 is fixed to the sound converter 17 by the fixing portion 7B.

The shapes of the fixing portions 7A and 7B are not limited to the above-described respective examples. However, the fixing portions 7A and 7B each preferably have a shape in which the fixing portion 7A or 7B is included in the joining region 5 when viewed in the direction perpendicular to the main surface of the waterproof sound-transmitting membrane 2, since sound is mainly transmitted through the openings 8 of the fixing portions 7A and 7B. The thickness of the waterproof sound-transmitting member 1 further including the fixing portion 7A and/or 7B is determined including the thickness of the fixing portion.

The waterproof sound-transmitting member of the present invention can have any layer other than the above-described layers, and/or a member, as long as the effects of the present invention are obtained.

The waterproofness of the waterproof sound-transmitting member 1 can be evaluated on the basis of water entry pressure (limit water entry pressure). The water entry pressure of the waterproof sound-transmitting member 1 can be measured according to the above-described method for measuring the water entry pressure of the waterproof sound-transmitting membrane 2. However, upon the measurement, the water pressure is applied to the waterproof sound-transmitting member 1 from the waterproof sound-transmitting membrane 2 side. The water entry pressure of the waterproof sound-transmitting member 1 is normally higher than the water entry pressure of the waterproof sound-transmitting membrane 2.

The waterproofness of the waterproof sound-transmitting member 1 can also be evaluated by a water pressure retention test. The water pressure retention test can be performed in the same manner as the water pressure retention test for the waterproof sound-transmitting membrane. However, in the test, the water pressure is applied to the waterproof sound-transmitting member 1 from the waterproof sound-transmitting membrane 2 side. The waterproof sound-transmitting member 1 can be a member in which water leakage does not occur at the waterproof sound-transmitting membrane 2 even when the water pressure retention test is performed under the conditions of a water pressure of 60 kPa and a water pressure application time of 10 minutes. The waterproof sound-transmitting member 1 can be a member in which water leakage does not occur at the waterproof sound-transmitting membrane 2 even when the water pressure retention test is performed under the conditions of a water pressure of 500 kPa and a water pressure application time of 10 minutes. The waterproof sound-transmitting member 1 can be a member in which water leakage does not occur at the waterproof sound-transmitting membrane 2 even when the water pressure retention test is performed under the conditions of a water pressure of 700 kPa and a water pressure application time of 30 minutes. The waterproof sound-transmitting member 1 can be a member in which water leakage does not occur at the waterproof sound-transmitting membrane 2 even when the water pressure retention test is performed repeatedly 30 times under the conditions of a water pressure of 700 kPa and a water pressure application time of 30 minutes with the interval between each test being set as 1 minute.

The sound transmission characteristics of the waterproof sound-transmitting member 1 can be evaluated on the basis of insertion loss at 1 kHz (insertion loss for sound having a frequency of 1 kHz). The insertion loss at 1 kHz of the waterproof sound-transmitting member 1 is, for example, 9.5 dB or less, and may be 9 dB or less, 8.5 dB or less, 8 dB or less, or even 7.5 dB or less, when the area of the non-joining region 4 is 1.8 mm$^2$.

The sound transmission characteristics of the waterproof sound-transmitting member 1 can also be evaluated on the basis of insertion loss at 200 Hz (insertion loss for sound having a frequency of 200 Hz). The insertion loss at 200 Hz of the waterproof sound-transmitting member 1 is, for example, 10.5 dB or less, and may be 10 dB or less or even 9.5 dB or less, when the area of the non-joining region 4 is 1.8 mm$^2$.

The sound transmission characteristics of the waterproof sound-transmitting member 1 can also be evaluated on the basis of the ratio of an increment of the insertion loss of the waterproof sound-transmitting member 1 (increment with respect to the waterproof sound-transmitting membrane alone) to the insertion loss of the waterproof sound-transmitting membrane 2 (the insertion loss of the waterproof sound-transmitting membrane 2 itself measured without placing the support layer 3). The increment can be determined by the equation: [increment of insertion loss]=[insertion loss of waterproof sound-transmitting member 1]−[insertion loss of waterproof sound-transmitting membrane 2]. Regarding the waterproof sound-transmitting member 1, the above ratio at 1 kHz is, for example, 80% or less, and may be 70% or less, 60% or less, 50% or less, or even 40% or less, when the area of the non-joining region 4 is 1.8 mm$^2$. The above ratio at 200 Hz is, for example, 40% or less, and may be 35% or less or even 30% or less, when the area of the non-joining region 4 is 1.8 mm$^2$.

In the waterproof sound-transmitting member 1, a decrease in sound transmission characteristics due to water pressure can be inhibited. Even after the water pressure retention test under the conditions of a water pressure of 500 kPa and a water pressure application time of 10 minutes, the waterproof sound-transmitting member 1 exhibits, for example, an insertion loss at 1 kHz of 11 dB or less when the area of the non-joining region 4 is 1.8 mm$^2$. The insertion loss may be 10.5 dB or less, 10 dB or less, 9.5 dB or less, 9 dB or less, 8.5 dB or less, or even 8 dB or less. In addition, even after the water pressure retention test under the conditions of a water pressure of 500 kPa and a water pressure application time of 10 minutes, the waterproof sound-transmitting member 1 exhibits, for example, an insertion loss at 200 Hz of less than 12 dB when the area of the non-joining region 4 is 1.8 mm². The insertion loss may be 11.5 dB or less, 11 dB or less, or even 10.5 dB or less.

The sound transmission characteristics decrease rate of the waterproof sound-transmitting member 1 obtained from the respective insertion losses before and after the water pressure retention test (water pressure: 500 kPa, water pressure application time: 10 minutes) (calculated on the basis of insertion loss at 1 kHz) is, for example, 6.5% or less, and may be 6.0% or less or even 5.5% or less. The sound transmission characteristics decrease rate of the waterproof sound-transmitting member can be evaluated according to the above method for evaluating the sound transmission characteristics decrease rate of the waterproof sound-transmitting membrane, except that the object to be measured for insertion loss is changed from the waterproof sound-transmitting membrane to the waterproof sound-transmitting member.

Figure 9:
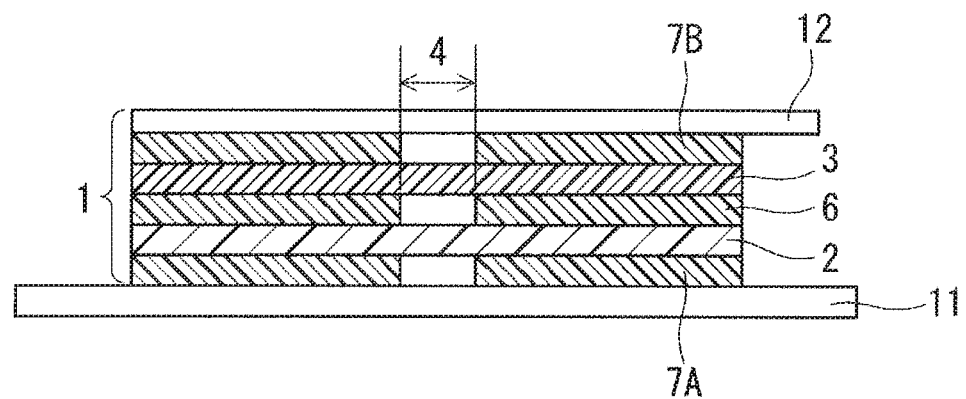
FIG. 9 is a cross-sectional view schematically showing still another example of the waterproof sound-transmitting member that is a kind of the waterproof member of the present invention.

The waterproof sound-transmitting member 1 can be supplied, for example, in a state of being placed on a sheet-shaped base film, or in a state of being placed on a band-shaped base film and wound on a roll or a reel. The fixing portion 7A or the fixing portion 7B can be used for placing the waterproof sound-transmitting member 1 onto the base film. A peeling layer that allows the waterproof sound-transmitting member 1 to be easily peeled from the base film may be formed on the surface, of the base film, on which the waterproof sound-transmitting member 1 is placed. As the base film, for example, a polymer film, paper, a metal film, and composite films thereof can be used. FIG. 9 shows an example of a state where the waterproof sound-transmitting member 1 is placed on the base film. In the example shown in FIG. 9, the waterproof sound-transmitting member 1 is placed on a base film 11 with the fixing portion 7A interposed therebetween. In addition, the waterproof sound-transmitting member 1 shown in FIG. 9 includes, on the fixing portion 7B, a separator 12 for protecting the fixing portion 7B and the non-joining region 4. When the waterproof sound-transmitting member 1 is used, the separator 12 is peeled off.

The application of the waterproof sound-transmitting member 1 is not limited. The waterproof sound-transmitting member 1 can be used for applications requiring both sound transmission and waterproofness, for example, a waterproof sound-transmitting structure, an article having a waterproof sound-transmitting structure, etc. The waterproof sound-transmitting member 1 is typically used for an electronic device having an audio function.

Figure 10:
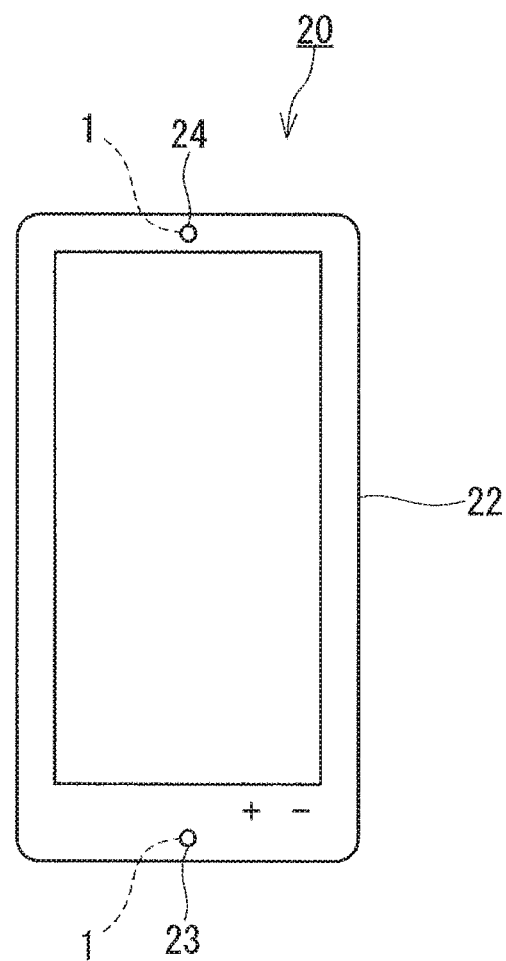
FIG. 10 is a front view schematically showing an example of an electronic device in which the waterproof sound-transmitting member that is a kind of the waterproof member of the present invention is attached to an opening (external sound-transmitting port) of a housing.

FIG. 10 shows an example of an electronic device for which the waterproof sound-transmitting member 1 is used. The electronic device shown in FIG. 10 is a smartphone 20. Sound converters that perform conversion between an electric signal and sound are placed inside a housing 22 of the smartphone 20. The sound converters (sound conversion parts) are, for example, a speaker and a microphone. The sound converter may be a microphone. The housing 22 is provided with an opening 23 and an opening 24 that are external sound-transmitting ports.

In the smartphone 20, a first waterproof sound-transmitting member 1 is fixed to an inner wall surface of the housing 22 so as to cover the opening 23. In addition, a second waterproof sound-transmitting member 1 is fixed to the inner wall surface of the housing 22 so as to cover the opening 24. In each waterproof sound-transmitting member 1, the surface at the waterproof sound-transmitting membrane 2 side faces the outside through the opening 23 or 24. In addition, the non-joining region 4 of each waterproof sound-transmitting member 1 overlaps the opening 23 or the opening 24 when viewed in the direction perpendicular to the main surface of the waterproof sound-transmitting membrane 2.

Each of the first and second waterproof sound-transmitting members 1 is fixed to the sound converter housed in the housing 22 (not shown). In each waterproof sound-transmitting member 1, the surface of the support layer 3 side is in contact with the sound converter. In addition, the non-joining region 4 of each waterproof sound-transmitting member 1 and an internal sound-transmitting port of the sound converter to which each waterproof sound-transmitting member 1 is fixed overlap each other when viewed in the direction perpendicular to the main surface of the waterproof sound-transmitting membrane 2.

The electronic device including the waterproof sound-transmitting member 1 is not limited to the smartphone 20. Examples of the electronic device include: wearable devices such as a smart watch and a wristband; various cameras including an action camera and a security camera; communication devices such as a mobile phone and a smartphone; virtual reality (VR) devices; augmented reality (AR) devices; and sensor devices.

In the case where the waterproof sound-transmitting membrane 2 has air permeability in the thickness direction thereof, the waterproof sound-transmitting member 1 can also be used as a waterproof air-permeable member. In this case, the waterproof sound-transmitting membrane 2 serves as a waterproof air-permeable membrane that prevents entry of water while permitting gas to pass therethrough. The waterproof air-permeable member can be attached to the housing such that the waterproof air-permeable member covers an opening (ventilation port) connecting the inside and the outside of the housing and the waterproof air-permeable membrane side of the waterproof air-permeable member faces the outside (external space). The waterproof air-permeable member including the waterproof air-permeable membrane can prevent entry of water into the housing through the opening in the electronic device while allowing ventilation between the inside and the outside of the housing through the opening. The electronic device does not have to have a sound conversion part. In addition, when water pressure is applied to the opening of the electronic device to which the waterproof air-permeable member is attached, the waterproof air-permeable membrane becomes deformed in the direction to the support layer 3 (direction from the outside to the inside of the housing) in the non-joining region 4. However, in the waterproof air-permeable member, deformation of the waterproof air-permeable membrane 2 is limited in a certain range mainly on the basis of the magnitude of the air resistance in the in-plane direction of the support layer 3 and the action as the above-described cushioning material (air cushion) due to the magnitude of the air resistance. Since the support layer 3 is included, the waterproof air-permeable member can have waterproofness (for example, limit water entry pressure) higher than the waterproofness of the waterproof air-permeable membrane.

The permanent deformation that remains in the waterproof air-permeable membrane even after being released from the water pressure decreases the air-permeability characteristics of the waterproof air-permeable member, and, for example, variation in air permeability occurs, or deviation from the air-permeability characteristics designed for the waterproof air-permeable member occurs. The support layer 3 can reduce the permanent deformation by limiting deformation of the waterproof air-permeable membrane. For example, in the case where the electronic device is a sensor device such as a pressure sensor, variation in air permeability and deviation from the designed air-permeability characteristics may adversely affect the performance of the device.

Furthermore, when the thickness of the support layer 3 in the non-joining region 4 is 500 μm or less, and the spacing distance between the waterproof air-permeable membrane and the support layer 3 is 150 μm or less, the responsiveness of air permeation of the waterproof air-permeable member can be improved. The improved responsiveness of air permeation is particularly advantageous when the electronic device is a sensor device such as a pressure sensor.

The waterproof member of the present invention that is a waterproof air-permeable member can have the same configuration as the waterproof sound-transmitting member 1 as long as the waterproof membrane has air permeability in the thickness direction thereof. As the waterproof air-permeable membrane included in the waterproof air-permeable member, a membrane having air permeability in the thickness direction thereof can be selected from among the waterproof sound-transmitting membranes 2 described above. In addition, the waterproof member of the present invention that is a waterproof air-permeable member can have the same characteristics as the waterproof sound-transmitting member 1.

In the waterproof member of the present invention that is a waterproof air-permeable member, deviation of the air-permeability characteristics due to water pressure can be inhibited. The degree of change in air-permeability characteristics before and after the water pressure retention test (water pressure: 500 kPa, water pressure application time: 10 minutes) is, for example, 5% or less, and can be 4% or less, 3% or less, 2% or less, or even 1% or less. The degree of change in air-permeability characteristics of the waterproof air-permeable member can be determined by the formula: $|(AP2-AP1)|/AP1 \times 100(\%)$, where the air permeability of the waterproof air-permeable member (air permeability in the direction of permeation through the waterproof air-permeable membrane and the support layer 3) before the water pressure retention test is AP1 and the air permeability of the waterproof air-permeable member after the water pressure retention test is AP2. In addition, the air permeability of the waterproof air-permeable member can be obtained as an air resistance (unit:seconds/100 mL) according to the Oken type testing machine method specified in JIS P8117: 2009. The recommended test piece size in the Oken type testing machine method is 50 mm×50 mm. Even when the size of a waterproof air-permeable member to be evaluated does not satisfy the recommended size, evaluation of air resistance according to the Oken type testing machine method is possible by using a measurement jig.

The measurement jig has a shape and a size that allow the measurement jig to be placed on an air permeability measuring portion of the Oken type testing machine, and the thickness and the material of the measurement jig are a thickness and a material that do not change by a differential pressure applied to a test piece upon measurement of air resistance. An example of the measurement jig is a polycarbonate disc having a thickness of 2 mm and a diameter of 47 mm. A through hole having an opening with a smaller size than a waterproof air-permeable member to be evaluated is provided at the center in a surface of the measurement jig. The through hole typically has a circular cross-section and has a diameter that allows the opening of the through hole to be fully covered with the waterproof air-permeable member to be evaluated. As the diameter of the through hole, for example, 1 mm or 2 mm can be adopted. Next, the waterproof air-permeable member to be evaluated is fixed to one surface of the measurement jig so as to cover the opening. The fixation is performed such that, during measurement of air resistance, air passes through only the non-joining region 4, and the fixed portion does not hinder passing of air in the non-joining region 4. The waterproof air-permeable membrane may face the measurement jig side, or the support layer 3 may face the measurement jig side. For fixing the waterproof air-permeable member, a double-faced adhesive tape having a ventilation port punched in a center portion thereof with a shape that matches the shape of the opening can be used. The double-faced adhesive tape can be placed between the measurement jig and the waterproof air-permeable member such that the circumference of the ventilation port and the circumference of the opening coincide with each other. Next, the measurement jig having the waterproof air-permeable member fixed thereto is set on the air permeability measuring portion of the Oken type testing machine such that the fixed surface of the member is at the downstream side of airflow during measurement, a test by the Oken type testing machine method is conducted, and an air resistance indication value t2 indicated by the testing machine is recorded. Next, the recorded air resistance indication value t2 is converted into a value $t_K$ per effective test area of 6.452 [cm$^2$] specified in the Oken type testing machine method, by the equation $t_K=\{t2\times(\text{area of non-joining region 4 [cm}^2\text{]})/6.452 \text{ [cm}^2\text{]}\}$, and the obtained conversion value $t_K$ can be regarded as the air resistance of the waterproof air-permeable member measured according to the Oken type testing machine method.

Examples of the electronic device for which the waterproof member of the present invention that is a waterproof air-permeable member can be used include sensor devices such as a pressure sensor, a flow rate sensor, and a gas concentration sensor (O$_2$ sensor, etc.). However, the electronic device is not limited to the above examples.

As described above, the waterproof member of the present invention may be a waterproof sound-transmitting member including a waterproof sound-transmitting membrane configured to prevent entry of water while permitting sound to pass therethrough, and a support layer having air permeability in a thickness direction thereof, wherein
　the waterproof sound-transmitting member has
　　a joining region where the waterproof sound-transmitting membrane and the support layer are joined, and
　　a non-joining region where the waterproof sound-transmitting membrane and the support layer are spaced apart from each other,
　the non-joining region is surrounded by the joining region when viewed in a direction perpendicular to a main surface of the waterproof sound-transmitting membrane,
　a thickness of the support layer in the non-joining region is 500 μm or less, and
　an air resistance in an in-plane direction of the support layer is greater than 80,000 seconds/100 mL.

Moreover, the waterproof member of the present invention may be a waterproof air-permeable member including a waterproof air-permeable membrane configured to prevent entry of water while permitting gas to pass therethrough, and a support layer having air permeability in a thickness direction thereof, wherein
　the waterproof air-permeable member has
　　a joining region where the waterproof air-permeable membrane and the support layer are joined, and a non-joining region where the waterproof air-permeable membrane and the support layer are spaced apart from each other, the non-joining region is surrounded by the joining region when viewed in a direction perpendicular to a main surface of the waterproof air-permeable membrane, a thickness of the support layer in the non-joining region is 500 μm or less, and an air resistance in an in-plane direction of the support layer is greater than 80,000 seconds/100 mL.

EXAMPLES

Hereinafter, the present invention will be described more specifically by way of Examples. The present invention is not limited to the following Examples. In the following Examples, for convenience, membranes that can be used as air-permeable membranes are also referred to as sound-transmitting membranes.

(Preparation of Waterproof Sound-Transmitting Membrane)

The following sound-transmitting membranes A and B were prepared as waterproof sound-transmitting membranes.

[Sound-Transmitting Membrane A]

1 part by mass of a fluorine-based surfactant (MEGAFAC F-142D, manufactured by DIC) per 100 parts by mass of PTFE was added to a PTFE dispersion that is a dispersion liquid of PTFE particles (concentration of PTFE particles: 40% by mass, average particle diameter of PTFE particles: 0.2 μm, containing 6 parts by mass of a nonionic surfactant per 100 parts by mass of PTFE). Next, a coating membrane (thickness: 20 μm) of the above PTFE dispersion containing the fluorine-based surfactant was formed on the surface of a band-shaped polyimide substrate (thickness: 125 μm). The coating membrane was formed by immersing the polyimide substrate in the PTFE dispersion and then pulling up the polyimide substrate. Next, the entirety of the substrate and the coating membrane was heated to form a cast PTFE membrane. The heating was performed in two stages, first heating (100° C., 1 minute) and subsequent second heating (390° C., 1 minute). The first heating promoted removal of the dispersion medium contained in the coating membrane, and the second heating promoted the formation of the cast membrane based on binding of the PTFE particles contained in the coating membrane. Formation of a coating membrane and subsequent first and second heating were repeated further twice, and the formed PTFE cast membrane (thickness: 25 μm) was then peeled from the polyimide substrate.

Next, the peeled cast membrane was rolled in an MD direction (longitudinal direction) and further stretched in a TD direction (width direction). The rolling in the MD direction was performed by roll rolling. The rolling ratio (area ratio) was set to 2.0 times, and the temperature (roll temperature) was set to 170° C. The stretching in the TD direction was performed with a tenter stretching machine. The stretch ratio in the TD direction was set to 2.0 times, and the temperature (temperature of stretching atmosphere) was set to 300° C. Thus, the sound-transmitting membrane A which is a microporous PTFE membrane was obtained.

The thickness of the obtained sound-transmitting membrane A was 10 μm, the surface density thereof was 14.5 g/m², the porosity thereof was 30%, the air permeability in the thickness direction thereof was 100 seconds/100 mL as represented by a Gurley air permeability, and the water entry pressure (limit water entry pressure) thereof was 1600 kPa.

[Sound-Transmitting Membrane B]

A non-porous PET film (LUMIRROR #5AF53, manufactured by Toray Industries, Inc.) was prepared as the sound-transmitting membrane B. The thickness of the sound-transmitting membrane B was 4 μm, the surface density thereof was 5.5 g/m², the air permeability in the thickness direction thereof was 100,000 seconds/100 mL or more as presented as a Gurley air permeability, and the water entry pressure (limit water entry pressure) thereof was 650 kPa.

(Preparation of Support Layer)

In the present example, nine types of waterproof sound-transmitting members (samples 1 to 9) were produced. For the respective samples, the following support layers were prepared.

1. Stainless Perforated Metal

Samples 1 and 4 and Sample 6 (Comparative Example)

Perforated metals formed from SUS304 and having a thickness of 100 μm (opening ratio: 19%, air permeability in thickness direction: 500 cm³/(cm²·sec) or more, air resistance in in-plane direction: greater than 300,000 seconds/100 mL, opening shape of each through hole: a circular shape having a diameter of 0.15 mm when viewed from a direction perpendicular to a main surface) were prepared.

Sample 2

A perforated metal formed from SUS304 and having a thickness of 200 μm (opening ratio: 19%, air permeability in thickness direction: 500 cm³/(cm²·sec) or more, air resistance in in-plane direction: greater than 300,000 seconds/100 mL, opening shape of each through hole: a circular shape having a diameter of 0.15 mm when viewed from a direction perpendicular to a main surface) was prepared.

Sample 3

A perforated metal formed from SUS304 and having a thickness of 500 μm (opening ratio: 19%, air permeability in thickness direction: 500 cm³/(cm²·sec) or more, air resistance in in-plane direction: greater than 300,000 seconds/100 mL, opening shape of each through hole: a circular shape having a diameter of 0.15 mm when viewed from a direction perpendicular to a main surface) was prepared.

Sample 5 (Comparative Example)

A perforated metal formed from SUS304 and having a thickness of 1000 μm (opening ratio: 19%, air permeability in thickness direction: 500 cm³/(cm²·sec) or more, air resistance in in-plane direction: greater than 300,000 seconds/100 mL, opening shape of each through hole: a circular shape having a diameter of 0.15 mm when viewed from a direction perpendicular to a main surface) was prepared.

2. Stainless Wire Mesh

Sample 7 (Comparative Example)

100 (thickness: 200 μm, space ratio: 50%, air permeability in thickness direction: 500 cm³/(cm²·sec) or more, air resistance in in-plane direction: 35 seconds/100 mL), available from Eggs (TAIHO TRADING).

3. Polypropylene Net

Sample 8 (Comparative Example)

Conwed Net X06065 (thickness: 350 μm, space ratio: 50%, air permeability in thickness direction: 500 cm³/(cm²·sec) or more, air resistance in in-plane direction: 54,000 seconds/100 mL), available from SAN-AI OIL CO., LTD.

4. Nonwoven Fabric

Sample 9 (Comparative Example)

HOP60HCF (material: polyethylene, thickness: 170 µm, air permeability in thickness direction: 46.0 cm$^3$/(cm$^2$·sec), air resistance in in-plane direction: 60,300 seconds/100 mL), manufactured by Hirose Paper Mfg Co., Ltd.

(Production of Waterproof Sound-Transmitting Member)

[Samples 1 to 3, 5, and 7 to 9]

The prepared sound-transmitting membrane A and support layers were used to produce samples 1 to 3, 5, and 7 to 9 in each of which the spacing distance between the waterproof sound-transmitting membrane and the support layer in the non-joining region is 50 µm. Samples 1 to 3, 5, and 7 to 9 were produced by the following procedure.

The prepared sound-transmitting membranes A and support layers were each cut into a circle having a diameter of 5.8 mm. Separately from this, a double-faced adhesive tape A (a ring shape with an outer diameter of 5.8 mm and an inner diameter of 1.5 mm, thickness: 50 µm, No. 5605 manufactured by Nitto Denko Corporation) and a double-faced adhesive tape B (a ring shape with an outer diameter of 5.8 mm and an inner diameter of 1.5 mm, thickness: 50 µm, No. 5605 manufactured by Nitto Denko Corporation) were prepared.

Next, the double-faced adhesive tape A was attached to one main surface of the sound-transmitting membrane A, and the double-faced adhesive tape B was attached to the other main surface of the sound-transmitting membrane A. The double-faced adhesive tapes A and B were attached to the sound-transmitting membrane A such that the outer circumferences of the tapes and the circumference of the sound-transmitting membrane A coincided with each other. Next, the double-faced adhesive tape A on the one main surface and the support layer were attached together such that the double-faced adhesive tape A was interposed between the waterproof sound-transmitting membrane and the support layer. The support layer was attached such that the outer circumference of the double-faced adhesive tape A and the circumference of the support layer coincided with each other. Next, a further double-faced adhesive tape A was attached to the exposed surface of the support layer. The further double-faced adhesive tape A was attached to the support layer such that the outer circumference of the tape and the circumference of the support layer coincided with each other. Thus, samples 1 to 3, 5, and 7 to 9 were produced, which are each a waterproof sound-transmitting member in which the area of the non-joining region is 1.8 mm$^2$, and the spacing distance between the waterproof sound-transmitting membrane and the support layer in the non-joining region is 50 µm, and which has a fixing portion composed of a double-faced adhesive tape, on each main surface. In each sample, the proportion of the area of the non-joining region to the sum of the area of the joining region and the area of the non-joining region when viewed in the direction perpendicular to the main surface of the waterproof sound-transmitting membrane was 7%.

[Sample 4]

The prepared sound-transmitting membrane A and support layer were used to produce sample 4 in which the spacing distance between the waterproof sound-transmitting membrane and the support layer in the non-joining region is 150 µm. Sample 4 was produced in the same manner as samples 1 to 3, 5, and 7 to 9, except that a double-faced adhesive tape having a thickness of 150 µm and a ring shape with an outer diameter of 5.8 mm and an inner diameter of 1.5 mm (No. 5615 manufactured by Nitto Denko Corporation) was used as the double-faced adhesive tape A.

[Sample 6]

The prepared sound-transmitting membrane A and support layer were used to produce sample 6 in which the spacing distance between the waterproof sound-transmitting membrane and the support layer in the non-joining region is 500 µm. Sample 6 was produced in the same manner as samples 1 to 3, 5, and 7 to 9, except that a double-faced adhesive tape having a thickness of 500 µm and a ring shape with an outer diameter of 5.8 mm and an inner diameter of 1.5 mm (produced by stacking two tapes of No. 5620 (thickness: 200 µm) manufactured by Nitto Denko Corporation and one tape of No. 5610 (thickness: 100 µm) manufactured by Nitto Denko Corporation) was used as the double-faced adhesive tape A.

(Evaluation Methods)

Next, methods for evaluating the waterproof sound-transmitting membranes and the support layers used for producing samples 1 to 9, and methods for evaluating produced samples 1 to 9 will be described.

[Thickness]

The thicknesses of the waterproof sound-transmitting membranes and the support layers were measured with a dial gauge.

[Surface Density]

The surface densities (weights per unit area) of the waterproof sound-transmitting membranes were each obtained by measuring the mass of the waterproof sound-transmitting membrane punched out in a circle having a diameter of 48 mm and converting the measured mass into a mass per 1 m$^2$ of the main surface area.

[Porosity]

The porosities of the waterproof sound-transmitting membranes were obtained by the above-described method.

[Air Permeability in Thickness Direction]

The air permeability in the thickness direction of each waterproof sound-transmitting membrane was obtained as a Gurley air permeability according to Method B (Gurley method) of air permeability measurement specified in JIS L1096: 2010. The air permeability in the thickness direction of each support layer having higher air permeability than the waterproof sound-transmitting membranes was obtained according to Method A (Frazier method) of air permeability measurement specified in JIS L1096: 2010.

[Air Resistance in In-Plane Direction]

The air resistance in the in-plane direction of each support layer was evaluated using a measurement jig by applying the air resistance test method by the Oken type testing machine method specified in JIS P8117: 2009. Specifically, the air resistance in the in-plane direction of each support layer was evaluated by the following method.

Figure 11:
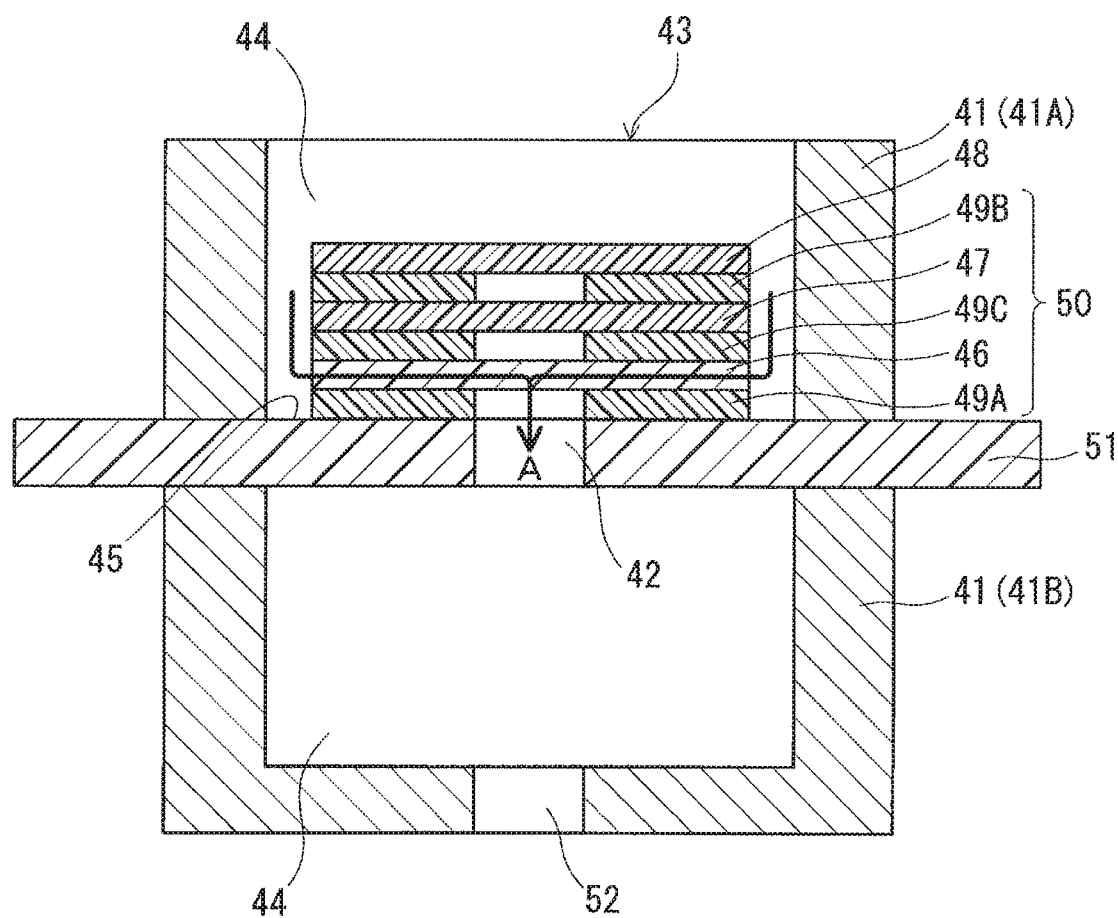
FIG. 11 is a schematic diagram for describing a method for evaluating the air resistance in an in-plane direction of a support layer.

First, a polycarbonate disc having a through hole 42 (having a circular cross-section with a diameter of 1.5 mm) provided at the center thereof and having a thickness of 2 mm and a diameter of 47 mm was prepared as a measurement jig 51 (see FIG. 11). The shape and the size of the cross-section of the through hole 42 were caused to coincide with the shape and the size of the inner circumference of a fixing portion 49A in a sample 50 that is a sample produced as described above and includes a support layer 46 to be evaluated. Next, the sample 50 was fixed to one surface 45 of the measurement jig 51. As shown in FIG. 11, the sample 50 was fixed to the one surface 45 by using the fixing portion (double-faced adhesive tape) 49A at the support layer 46 side of the sample 50 such that the inner circumference of the fixing portion 49A and the circumference of the through hole 42 coincided with each other and no gap occurred between the fixing portion 49A and the one surface 45. Next, a PET film 48 (a circular shape with a diameter of 5.8 mm, thickness: 50 μm, LUMIRROR 50510, manufactured by Toray Industries, Inc.) was joined to the main surface at the sound-transmitting membrane 47 side of the sample 50 with a fixing portion (double-faced adhesive tape) 49B interposed therebetween. The PET film 48 was joined such that the outer circumference of the fixing portion 49B and the circumference of the PET film 48 coincided with each other and no gap occurred between the fixing portion 49B and the PET film 48.

Next, the measurement jig 51 having the sample 50 fixed thereto was fixed to an air permeability measuring portion 41 of a pressure sensor type air permeability tester (EG02-S, manufactured by Asahi Seiko Co., Ltd., upper limit of measurable range: 300,000 seconds/100 mL) which is a kind of the Oken type air permeability testing machine. More specifically, in the air permeability measuring portion 41 having a structure that includes a pair of portions 41A and 41B and in which a membrane or sheet-shaped object to be evaluated can be held between the portion 41A and the portion 41B, the measurement jig 51 was fixed between the portion 41A and the portion 41B. Upon evaluating the air resistance in the in-plane direction of an object to be evaluated, pressure which allows air to pass from an opening 43 of the portion 41A through the object to be evaluated in a direction to a through hole 52 of the portion 41B is applied to the air permeability measuring portion 41. The measurement jig 51 was fixed such that the sample 50 was housed in an internal space 44 of the portion 41A having the opening 43 and no gap through which the above pressure can be released occurred between the portions 41A and 41B and the measurement jig 51.

Next, the testing machine was operated, the above pressure (pressure equivalent to 500 mm of water column specified in the Oken type testing machine method of JIS P8117:2009) was applied to the air permeability measuring portion 41, the air resistance (the air resistance in a path A shown in FIG. 11) between the outer peripheral side surface of the support layer 46 and a portion, of the support layer 46, facing the through hole 42 (a circular portion with a diameter of 1.5 mm corresponding to the opening of the fixing portion 49A) was measured, and this air resistance was regarded as the air resistance in the in-plane direction of the support layer 46. The air resistance evaluated, in the same manner as described above, for a joined body of the PET film 48 and a sound-transmitting membrane 47 not including the support layer 46 and the fixing portion 49A (the joined body was fixed to the one surface 45 of the measurement jig 51 by a fixing portion 49C) exceeded 300,000 seconds/100 mL which is the measurement limit of the testing machine. Therefore, the sample 50 including the sound-transmitting membrane 47 was used in the above method, and it is possible to evaluate the air resistance in the in-plane direction of the support layer 46 by this method. However, the sound-transmitting membrane 47 is not necessarily required in order to evaluate the air resistance in the in-plane direction of the support layer 46, and the air resistance in the in-plane direction of the support layer 46 can be measured by using the measurement jig 51 and the PET film 48 without the sound-transmitting membrane 47.

[Water Entry Pressure]

The water entry pressure (limit water entry pressure) of each waterproof sound-transmitting membrane was measured according to Method A (low water pressure method) or Method B (high water pressure method) of the water resistance test in JIS L1092: 2009 using the above-described measurement jig.

[Water Pressure Retention Test]

A water pressure retention test for the waterproof sound-transmitting membranes and samples 1 to 9 was performed by the above-described method. The conditions for the test were the following conditions a and b. In the test, the case where water leakage occurred at the waterproof sound-transmitting membrane was determined as bad (x), and the case where no water leakage occurred at the waterproof sound-transmitting membrane was determined as good (○).

Condition a: the water pressure was 500 kPa, and the water pressure application time was 10 minutes.

Condition b: the water pressure was 700 kPa, the water pressure application time was 30 minutes, and the test was repeated 30 times with the interval between each test being set as 1 minute.

[Insertion Loss]

Insertion losses (insertion loss at 200 Hz and insertion loss at 1 kHz) of the waterproof sound-transmitting membranes and samples 1 to 9 were measured before and after the water pressure retention test was performed. For samples 1 to 9 and the sound-transmitting membranes A and B, insertion losses before and after the water pressure retention test under Condition a were measured. The insertion losses were measured by the following method using a dummy housing simulating a housing of a mobile phone.

Figure 12:
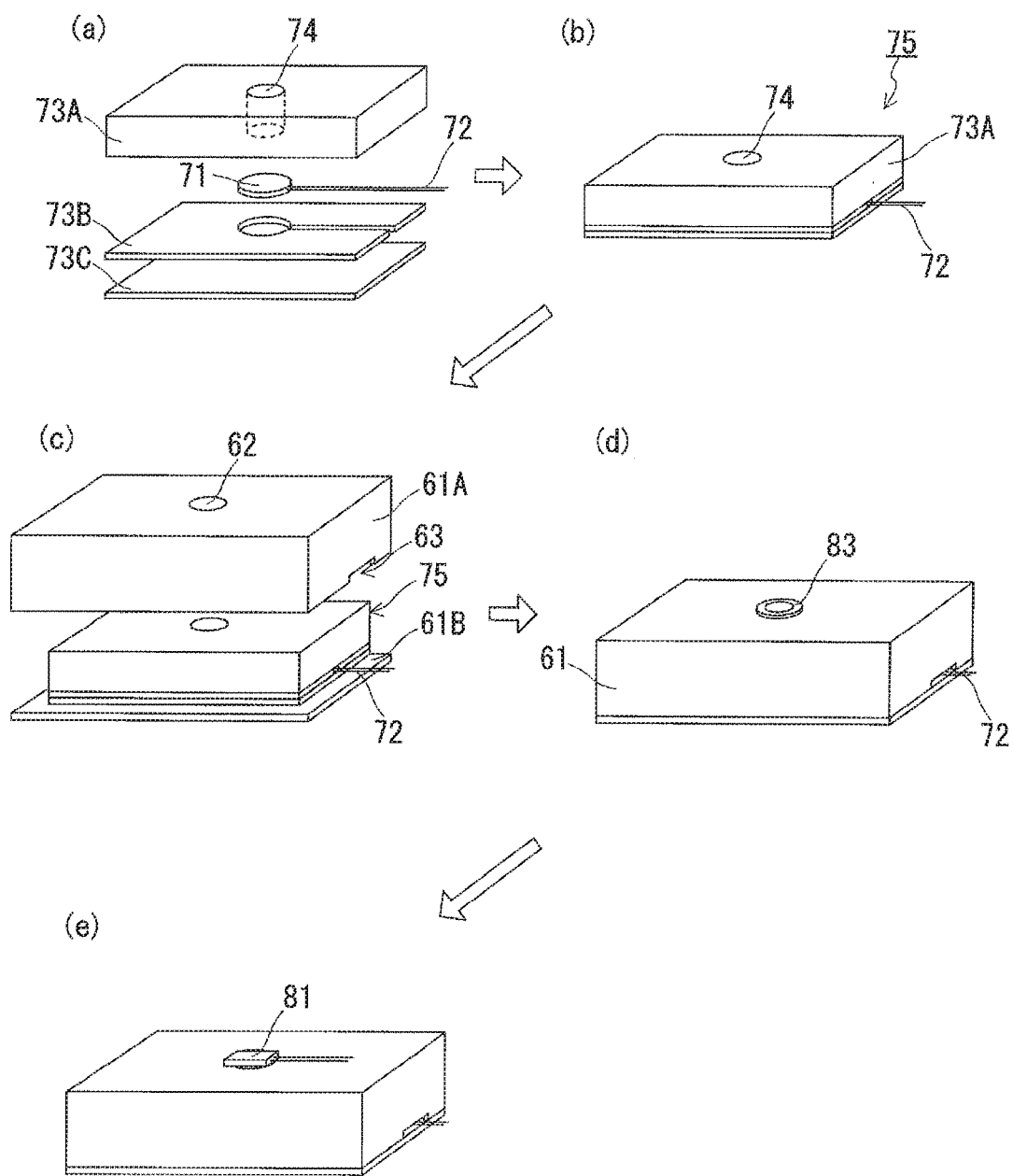
FIG. 12 is a schematic diagram for describing a method for evaluating the sound transmission characteristics (insertion loss) of a waterproof sound-transmitting member.

As shown in (a) and (b) of FIG. 12, a speaker unit 75 to be housed in the dummy housing was produced. Specifically, the speaker unit 75 was produced as follows. A speaker 71 (SCC-16A, manufactured by STAR MICRONICS CO., LTD.), which is a sound source, and fillers 73A, 73B, and 73C composed of a urethane sponge and used for housing the speaker 71 and preventing unnecessary diffusion of sound from the speaker (preventing, as much as possible, generation of sound to be inputted into a microphone for evaluation without passing through a waterproof sound-transmitting membrane or waterproof sound-transmitting member sample to be evaluated), were prepared. A sound-transmitting port 74 having a circular cross-section with a diameter of 5 mm was provided in the filler 73A in the thickness direction thereof. A cut having a shape corresponding to the shape of the speaker 71 and a cut used for housing a speaker cable 72 and guiding the speaker cable 72 to the outside of the speaker unit 75 were provided in the filler 73B. Next, the fillers 73C and 73B were overlaid on each other, and the speaker 71 and the speaker cable 72 were housed in the cuts of the filler 73B. Next, the filler 73A was overlaid such that sound is transmitted from the speaker 71 through the sound-transmitting port 74 to the outside of the speaker unit 75, to obtain the speaker unit 75 ((b) of FIG. 12).

Next, as shown in (c) of FIG. 12, the produced speaker unit 75 was housed inside a dummy housing 61 (made of polystyrene, outer shape: 60 mm×50 mm×28 mm) simulating a housing of a mobile phone. Specifically, the speaker unit 75 was housed as follows. The prepared dummy housing 61 includes two portions 61A and 61B, and the portions 61A and 61B can be fitted to each other. A sound-transmitting port 62 (having a circular cross-section with an inner diameter of 1 mm) through which sound emitted from the speaker unit 75 housed inside is transmitted to the outside of the dummy housing 61 and a guide hole 63 for guiding the speaker cable 72 to the outside of the dummy housing 61 are provided in the portion 61A. By fitting the portions 61A and 61B to each other, a space having no opening other than the sound-transmitting port 62 and the guide hole 63 was formed inside the dummy housing 61. The produced speaker unit 75 was placed on the portion 61B, and the portion 61A and the portion 61B were then fitted to each other, thereby housing the speaker unit 75 inside the dummy housing 61. At this time, the sound-transmitting port 74 of the speaker unit 75 and the sound-transmitting port 62 of the portion 61A were overlapped such that sound is transmitted from the speaker 71 through both sound-transmitting ports 74 and 62 to the outside of the dummy housing 61. The speaker cable 72 was drawn from the guide hole 63 to the outside of the dummy housing 61, and the guide hole 63 was closed with putty.

Next, as shown in (d) of FIG. 12, each sample 83 (area of non-joining region: 1.8 mm$^2$) before or after the water pressure retention test was fixed to the sound-transmitting port 62 of the dummy housing 61 by the fixing portion (double-faced adhesive tape A) at the waterproof sound-transmitting membrane side of the sample. The sample 83 was fixed such that the entirety of the non-joining region of the sample 83 was located in the opening of the sound-transmitting port 62 when viewed in the direction perpendicular to the main surface of the waterproof sound-transmitting membrane.

Next, as shown in (e) of FIG. 12, a microphone 81 (SPU0410LR5H, manufactured by Knowles Acoustics) was fixed to the support layer side of the sample 83 so as to cover the non-joining region of the sample 83. The microphone 81 was fixed by the fixing portion (further double-faced adhesive tape A) at the support layer side of the sample 83. The distance between the speaker 71 and the microphone 81 when the microphone 81 was fixed varies by up to about 2 mm depending on the thickness of the waterproof sound-transmitting member sample to be evaluated, but was within the range of approximately 22 to 24 mm. Next, the speaker 71 and the microphone 81 were connected to an acoustic evaluation apparatus (Multi-analyzer System 3560-B-030, manufactured by Brueel & Kjaer Sound & Vibration Measurement A/S), a solid state response (SSR) mode (test signal: 20 Hz to 20 kHz, sweep up) was selected and executed as an evaluation method, and the insertion loss of the sample 83 was evaluated. The insertion loss was automatically determined from a test signal inputted from the acoustic evaluation apparatus to the speaker 71 and a signal received by the microphone 81. Prior to evaluating the insertion loss of the sample 83, a value (blank value) of insertion loss when the sample 83 was removed had been determined in advance. The blank value was −24 dB at a frequency of 1 kHz. The insertion loss of the sample 83 is a value obtained by subtracting the blank value from a value measured by the acoustic evaluation apparatus. As the value of insertion loss is lower, sound outputted from the speaker 71 is maintained at a higher level (sound volume).

The insertion loss of each waterproof sound-transmitting membrane was measured as follows. The waterproof sound-transmitting membrane, before or after the water pressure retention test, to be evaluated was cut out into a circle having a diameter of 5.8 mm. The double-faced adhesive tape A was attached to each main surface of the cut-out waterproof sound-transmitting membrane. Each tape A was attached to the waterproof sound-transmitting membrane such that the outer circumference of the tape and the circumference of the waterproof sound-transmitting membrane coincided with each other. Next, the waterproof sound-transmitting membrane was fixed to the sound-transmitting port 62 of the dummy housing 61 by one of the tapes A. The waterproof sound-transmitting membrane was fixed such that the entirety of the sound-transmission region (circular region with a diameter of 1.5 mm corresponding to the opening of the double-faced adhesive tape A) was located in the opening of the sound-transmitting port 62 when viewed in the direction perpendicular to the main surface of the membrane. Next, the microphone 81 was fixed so as to cover the sound-transmission region of the waterproof sound-transmitting membrane, and the insertion loss of the waterproof sound-transmitting membrane was measured by the above-described method. The microphone 81 was fixed to the waterproof sound-transmitting membrane by the other tape A.

[Sound Transmission Characteristics Decrease Rate]

The sound transmission characteristics decrease rates of the waterproof sound-transmitting membranes and samples 1 to 9 were determined by the equation: sound transmission characteristics decrease rate [%]=(L2−L1)/L1×100 from the insertion loss (insertion loss at 1 kHz) L1 before the water pressure retention test and the insertion loss (insertion loss at 1 kHz) L2 after the water pressure retention test.

[Ratio of Increment of Insertion Loss of Waterproof Sound-Transmitting Member to Insertion Loss of Waterproof Sound-Transmitting Membrane]

The "ratio of the increment of the insertion loss of the waterproof sound-transmitting member to the insertion loss of the waterproof sound-transmitting membrane" in each of samples 1 to 9 was obtained at each of frequencies of 200 Hz and 1 kHz by the following equation.

Ratio (%)=(insertion loss of each sample−insertion loss of sound-transmitting membrane $A$)/insertion loss of sound-transmitting membrane $A$×100     Equation:

[Degree of Change in Air-Permeability Characteristics]

For each of the sound-transmitting membrane A and samples 1 and 2 including the sound-transmitting membrane A, an air permeability (air permeability in the direction of permeation through the sound-transmitting membrane A or through the sound-transmitting membrane A and the support layer) was measured before and after the water pressure retention test was performed, and the degrees of change in air-permeability characteristics of the sound-transmitting membrane A and the samples before and after the water pressure retention test were evaluated. The degree of change in air-permeability characteristics was determined by the formula: |(AP2−AP1)|/AP1×100(%), where the air permeability of each of the sound-transmitting membrane A and the samples before the water pressure retention test was A1 and the air permeability of each of the sound-transmitting membrane A and the samples after the water pressure retention test was A2. The air permeability of each of the sound-transmitting membrane A and the samples was obtained as an air resistance $t_K$ with a pressure sensor type air permeability tester (EG02-S, manufactured by Asahi Seiko Co., Ltd.) capable of performing the Oken type testing machine method specified in JIS P8117: 2009, using the above-described measurement jig (a polycarbonate disc having a thickness of 2 mm and a diameter of 47 mm and having a through hole with a diameter of 1 mm). In addition, air permeability measurement after the water pressure retention test was performed after the sound-transmitting membrane or the sample was dried at 60° C. for 1 hour after the test.

Each table below shows the evaluation results for the sound-transmitting membranes A and B and samples 1 to 9.

TABLE 1

| Sample No. | | 1 | 2 | 3 | 4 |
|---|---|---|---|---|---|
| Sound-transmitting membrane | | | A | | |
| Support layer | | Stainless perforated metal | | | |
| Thickness | [μm] | 100 | 200 | 500 | 100 |
| Opening ratio | [%] | 19 | | | |
| Air permeability in thickness direction | [cm³/(cm²·sec)] | 500 or more | 500 or more | 500 or more | 500 or more |
| Air resistance | [seconds/100 mL] | Greater than 300,000 | Greater than 300,000 | Greater than 300,000 | Greater than 300,000 |
| Spacing distance between sound-transmitting membrane and support layer in non-joining region | [μm] | 50 | 50 | 50 | 150 |
| Water pressure retention test | 500 kPa × 10 min | ○ | ○ | ○ | ○ |
| | 700 kPa × 30 min × 30 cycles | ○ | ○ | ○ | ○ |
| Sound transmission characteristics before water pressure retention test | 200 Hz | 9.1 | 9.3 | 10.1 | 9.2 |
| | 1000 Hz | 7.4 | 7.5 | 8.5 | 7.4 |
| Sound transmission characteristics after water pressure retention test | 200 Hz | 10.2 | 10.3 | 10.7 | 10.2 |
| | 1000 Hz | 7.8 | 7.9 | 9.0 | 7.8 |
| Sound transmission characteristics decrease rate (1 kHz) | 1000 Hz | 5.8 | 5.3 | 5.9 | 5.4 |
| Ratio of increment of insertion loss of sample to insertion loss of sound-transmitting membrane (200 Hz) | | 22.3 | 25.7 | 36.5 | 24.3 |
| Ratio of increment of insertion loss of sample to insertion loss of sound-transmitting membrane (1 kHz) | | 36.5 | 38.9 | 57.4 | 37.0 |
| Degree of change in air-permeability characteristics | [%] | 2 | 3 | — | — |

TABLE 2

| Sample No. | | 5 (Com. Ex.) | 6 (Com. Ex.) | 7 (Com. Ex.) | 8 (Com. Ex.) | 9 (Com. Ex.) |
|---|---|---|---|---|---|---|
| Sound-transmitting membrane | | | | A | | |
| Support layer | | Stainless perforated metal | | Mesh Stainless skeleton | Net | Nonwoven fabric |
| Thickness | [μm] | 1000 | 100 | 200 | 350 | 170 |
| Opening ratio/space ratio | [%] | 19 | | 50 | 50 | — |
| Air permeability in thickness direction | [cm³/(cm²·sec)] | 500 or more | 500 or more | 500 or more | 500 or more | 46 |
| Air resistance | [seconds/100 mL] | Greater than 300,000 | Greater than 300,000 | 35 | 54000 | 60300 |
| Spacing distance between sound-transmitting membrane and support layer in non-joining region | [μm] | 50 | 500 | 50 | 50 | 50 |
| Water pressure retention test | 500 kPa × 10 min | ○ | ○ | ○ | ○ | ○ |
| | 700 kPa × 30 min × 30 cycles | ○ | ○ | ○ | ○ | ○ |
| Sound transmission characteristics before water pressure retention test | 200 Hz | 13.1 | 10.7 | 22.6 | 41.1 | 19.9 |
| | 1000 Hz | 11.3 | 9.9 | 12.3 | 26.5 | 11.5 |
| Sound transmission characteristics after water pressure retention test | 200 Hz | 14.2 | 12.0 | 24.3 | 43.9 | 21.3 |
| | 1000 Hz | 12.1 | 11.7 | 13.5 | 31.5 | 12.3 |
| Sound transmission characteristics decrease rate (1 kHz) | 1000 Hz | 7.1 | 18.2 | 9.8 | 18.9 | 6.6 |
| Ratio of increment of insertion loss of sample to insertion loss of sound-transmitting membrane (200 Hz) | | 77.0 | 44.6 | 205.4 | 455.4 | 168.8 |
| Ratio of increment of insertion loss of sample to insertion loss of sound-transmitting membrane (1 kHz) | | 109.3 | 83.3 | 127.8 | 390.7 | 113.7 |

TABLE 3

| Sound-transmitting membrane | | A | B |
|---|---|---|---|
| Material | | PTFE | PET |
| Thickness | [μm] | 10 | 4 |
| Weight per unit area | [g/m²] | 14.5 | 5.5 |
| porosity | [%] | 30 | 0 |
| Air permeability (Gurley) | [seconds/100 cc] | 100 | 100,000 or more |
| Water pressure retention test | 500 kPa × 10 min | ○ | ○ |
| | 700 kPa × 30 min × 30 cycles | × | × |
| Sound transmission characteristics before water pressure retention test | 200 Hz | 7.4 | 5.9 |
| | 1 kHz | 5.4 | 5.3 |

TABLE 3-continued

| Sound-transmitting membrane Material | | A<br>PTFE | B<br>PET |
|---|---|---|---|
| Sound transmission characteristics after water pressure retention test | 200 Hz<br>1 kHz | 8.5<br>6.7 | 39.1<br>30.0 |
| Sound transmission characteristics decrease rate (1 kHz) | [%] | 24.1 | 466.0 |
| Degree of change in air-permeability characteristics | [%] | 7 | — |

As shown in Tables 1 to 3, in samples 1 to 4 in which the thickness of the support layer in the non-joining region was 500 μm or less, the spacing distance between the waterproof sound-transmitting membrane and the support layer in the non-joining region was 150 μm or less, and the air resistance in the in-plane direction of the support layer was greater than 80,000 seconds/100 mL, high sound transmission characteristics (low insertion loss) were achieved. In addition, low values were obtained for not only insertion loss for sound of 1 kHz but also insertion loss for sound of 200 Hz. In samples 1 to 4, a decrease in the sound transmission characteristics by the water pressure retention test was inhibited as compared to samples 5 to 9 which are comparative examples.

Moreover, in samples 1 to 4, very high waterproofness was achieved, that is, no water leakage occurred at the waterproof sound-transmitting membrane even when the water pressure retention test was repeated 30 times under the conditions of a water pressure of 700 kPa and a water pressure application time of 30 minutes.

INDUSTRIAL APPLICABILITY

The technology of the present invention can be applied to various electronic devices including: wearable devices such as a smart watch; various cameras; communication devices such as a mobile phone and a smartphone; and sensor devices.

The invention claimed is:

1. A waterproof member comprising a waterproof membrane configured to prevent entry of water while permitting sound and/or gas to pass therethrough, and a support layer having air permeability in a thickness direction thereof, wherein
the waterproof member has
a joining region where the waterproof membrane and the support layer are joined, and
a non-joining region where the waterproof membrane and the support layer are spaced apart from each other,
the non-joining region is surrounded by the joining region when viewed in a direction perpendicular to a main surface of the waterproof membrane,
a thickness of the support layer in the non-joining region is 500 μm or less,
a spacing distance between the waterproof membrane and the support layer in the non-joining region is 150 μm or less, and
an air resistance in an in-plane direction of the support layer is greater than 80,000 seconds/100 mL.

2. The waterproof member according to claim 1, wherein the air resistance is greater than 300,000 seconds/100 mL.

3. The waterproof member according to claim 1, wherein the support layer is a metal plate having one or more through holes connecting one main surface and another main surface thereof.

4. The waterproof member according to claim 1, wherein the support layer is a perforated metal.

5. The waterproof member according to claim 1, wherein an area of the non-joining region when viewed in the perpendicular direction is 12 mm² or less.

6. The waterproof member according to claim 1, wherein a proportion of the area of the non-joining region to a sum of an area of the joining region and the area of the non-joining region when viewed in the perpendicular direction is 20% or less.

7. The waterproof member according to claim 1, wherein the waterproof membrane includes a polytetrafluoroethylene membrane.

8. The waterproof member according to claim 1, wherein an air permeability in a thickness direction of the waterproof membrane is 20 seconds/100 mL or more as represented by an air permeability obtained according to Method B (Gurley method) of air permeability measurement specified in JIS L1096: 2010.

9. The waterproof member according to claim 1, wherein a fixing portion having a shape surrounding the non-joining region when viewed in the direction perpendicular to the main surface of the waterproof membrane is formed on a surface, of the waterproof membrane, opposite to a surface, of the waterproof membrane, joined to the support layer and/or on a surface, of the support layer, opposite to a surface, of the support layer, joined to the waterproof membrane.

10. An electronic device comprising:
a housing having an opening; and
the waterproof member according to claim 1 attached to the housing so as to close the opening, wherein
the member is attached to the housing such that the waterproof membrane side of the member faces the outside of the housing and the support layer side of the member faces the inside of the housing.

11. The electronic device according to claim 10, wherein a sound conversion part configured to perform conversion between an electric signal and sound is housed in the housing, and
the opening is located between the sound conversion part and the outside of the housing.

* * * * *